United States Patent
Ko et al.

(10) Patent No.: US 10,043,947 B2
(45) Date of Patent: Aug. 7, 2018

(54) LIGHT EMITTING DEVICE

(71) Applicant: LG INNOTEK CO., LTD., Seoul (KR)

(72) Inventors: Eun Bin Ko, Seoul (KR); Bum Doo Park, Seoul (KR); Sang Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/309,544

(22) PCT Filed: Apr. 29, 2015

(86) PCT No.: PCT/KR2015/004307
§ 371 (c)(1),
(2) Date: Nov. 8, 2016

(87) PCT Pub. No.: WO2015/170848
PCT Pub. Date: Nov. 12, 2015

(65) Prior Publication Data
US 2017/0155017 A1    Jun. 1, 2017

(30) Foreign Application Priority Data

May 8, 2014    (KR) ................. 10-2014-0054684
May 14, 2014   (KR) ................. 10-2014-0057693
May 14, 2014   (KR) ................. 10-2014-0057696

(51) Int. Cl.
*H01L 33/36* (2010.01)
*H01L 33/58* (2010.01)
(Continued)

(52) U.S. Cl.
CPC .............. *H01L 33/36* (2013.01); *H01L 33/02* (2013.01); *H01L 33/387* (2013.01); *H01L 33/44* (2013.01);
(Continued)

(58) Field of Classification Search
CPC ......... H01L 33/36; H01L 33/58; H01L 33/02; H01L 33/387; H01L 33/44
See application file for complete search history.

(56) References Cited

U.S. PATENT DOCUMENTS 5,060,028 A   10/1991  Kuo et al.
7,713,776 B1   5/2010  Horng et al.
(Continued)

FOREIGN PATENT DOCUMENTS

EP    0378919 A2    7/1990
EP    1956663 A1    8/2008
(Continued)

OTHER PUBLICATIONS

International Search Report, issued in PCT/KR2015/004307 (PCT/ISA/210), dated Sep. 4, 2015.

*Primary Examiner* — Long Pham
(74) *Attorney, Agent, or Firm* — Birch, Stewart, Kolasch & Birch, LLP

(57) ABSTRACT

A light emitting device according to an embodiment comprises: a light emitting structure including a first conductive semiconductor layer, an active layer disposed under the first conductive semiconductor layer, and a second conductive semiconductor layer disposed under the active layer; a protective layer disposed above the light emitting structure and including a through region; a first electrode disposed in the through region and electrically connected to the first conductive semiconductor layer; an electrode pad electrically connected to the first electrode, and having a first region disposed on the first electrode and a second region disposed on the protective layer; and a second electrode electrically connected to the second conductive semiconductor layer.

20 Claims, 20 Drawing Sheets

(51) Int. Cl.
- H01L 33/02 (2010.01)
- H01L 33/38 (2010.01)
- H01L 33/44 (2010.01)
- H01L 33/04 (2010.01)
- H01L 33/12 (2010.01)
- H01L 33/14 (2010.01)

(52) U.S. Cl.
CPC .............. *H01L 33/58* (2013.01); *H01L 33/04* (2013.01); *H01L 33/12* (2013.01); *H01L 33/14* (2013.01); *H01L 2224/48091* (2013.01); *H01L 2924/181* (2013.01)

(56) References Cited

U.S. PATENT DOCUMENTS

| | | |
|---|---|---|
| 2002/0104997 A1 | 8/2002 | Kuo et al. |
| 2007/0075319 A1 | 4/2007 | Konno et al. |
| 2008/0283819 A1 | 11/2008 | Konno |
| 2009/0206322 A1 | 8/2009 | Brandes |
| 2009/0294784 A1 | 12/2009 | Nakahara et al. |
| 2010/0213485 A1 | 8/2010 | McKenzie et al. |
| 2010/0219442 A1* | 9/2010 | Lee ............... H01L 33/0079 257/99 |
| 2010/0264442 A1 | 10/2010 | Lee |
| 2010/0327299 A1 | 12/2010 | Chung et al. |
| 2011/0089435 A1 | 4/2011 | Bae et al. |
| 2011/0198641 A1 | 8/2011 | Yahata et al. |
| 2011/0220936 A1* | 9/2011 | Fujimoto ............ H01L 33/38 257/98 |
| 2012/0018765 A1 | 1/2012 | Mizogami et al. |
| 2012/0033444 A1 | 2/2012 | Moon et al. |
| 2012/0049756 A1 | 3/2012 | Schubert |
| 2012/0273793 A1 | 11/2012 | Nishikawa et al. |
| 2013/0207153 A1 | 8/2013 | Kamiya et al. |
| 2013/0234182 A1 | 9/2013 | Katsuno et al. |

FOREIGN PATENT DOCUMENTS

| | | |
|---|---|---|
| EP | 2315275 A1 | 4/2011 |
| JP | 10-256600 A | 9/1998 |
| JP | 2003-124517 A | 4/2003 |
| JP | 2004-140074 A | 5/2004 |
| JP | 2008-192690 A | 8/2008 |
| JP | 2010-206133 A | 9/2010 |
| JP | 2011-23504 A | 2/2011 |
| JP | 2011-192960 A | 9/2011 |
| JP | 2012-134280 A | 7/2012 |
| JP | 2012-231014 A | 11/2012 |
| JP | 2012-532438 A | 12/2012 |
| JP | 2013-58622 A | 3/2013 |
| JP | 2013-168444 A | 8/2013 |
| KR | 10-1998-052506 A | 9/1998 |
| KR | 10-2009-0066185 A | 6/2009 |
| KR | 10-2010-0023274 A | 3/2010 |
| KR | 10-2011-0083292 A | 7/2011 |
| KR | 10-2012-0137181 A | 12/2012 |
| KR | 10-2013-0106675 A | 9/2013 |
| WO | WO 2009/010762 A1 | 1/2009 |

* cited by examiner

LIGHT EMITTING DEVICE

CROSS REFERENCE TO RELATED APPLICATIONS

This application is the National Phase of PCT International Application No. PCT/KR2015/004307, filed on Apr. 29, 2015, which claims priority under 35 U.S.C. 119(a) to Patent Application Nos. 10-2014-0054684, filed in Republic of Korea on May 8, 2014, 10-2014-0057693, filed in Republic of Korea on May 14, 2014 and 10-2014-0057696, filed in Republic of Korea on May 14, 2014, all of which are hereby expressly incorporated by reference into the present application.

TECHNICAL FIELD

Embodiments relate to a light emitting device, a light emitting device package and a light unit.

BACKGROUND ART

As a light emitting device, light emitting diodes (LEDs) are widely used. A light emitting diode converts an electric signal into light such as infrared, visible or ultraviolet light using characteristics of compound semiconductors.

As light efficiency of a light emitting device increases, the light emitting device has been applied to various fields including a display apparatus and a lighting apparatus.

DISCLOSURE

Technical Problem

Embodiments provide a light emitting device, a light emitting device package and a light unit capable of improving light extraction efficiency.

Embodiments provide a light emitting device, a light emitting device package and a light unit capable of decreasing an operating voltage and improving reliability Embodiments provide a light emitting device, a light emitting device package and a light unit capable of decreasing an operating voltage and improving luminosity.

Technical Solution

A light emitting device according to an embodiment includes a light emitting structure including a first conductive semiconductor layer, an active layer disposed under the first conductive semiconductor layer and a second conductive semiconductor layer disposed under the active layer, a protective layer disposed on the light emitting structure and including a plurality of through-holes, a first electrode provided in the plurality of through-holes and including a plurality of metal dots electrically connected to the first conductive semiconductor layer, an electrode pad electrically connecting the plurality of metal dots configuring the first electrode and having a first area disposed on the first electrode and a second area disposed on the protective layer, and a second electrode electrically connected to the second conductive semiconductor layer.

A light emitting device according to an embodiment includes a light emitting structure including a first conductive semiconductor layer, an active layer disposed under the first conductive semiconductor layer and a second conductive semiconductor layer disposed under the active layer, an energy buffer layer disposed under the light emitting structure and including a first area, an energy band gap of which is constant according to a distance from the light emitting structure, and a second area, an energy band gap of which is gradually decreased according to a distance from the first area, a tensile strain barrier layer disposed under the energy buffer layer and has an energy band gap less than or equal to that of the second area, and a window layer disposed under the tensile strain barrier layer.

A light emitting device according to an embodiment includes a light emitting structure including a first conductive semiconductor layer, an active layer disposed under the first conductive semiconductor layer and a second conductive semiconductor layer disposed under the active layer, a first window layer disposed under the light emitting structure and including the same impurities as the second conductive semiconductor layer, a second window layer disposed under the first window layer, including impurities different from those included in the first window layer and having a higher impurity concentration than the first window layer, a first electrode disposed on the light emitting structure and electrically connected to the first conductive semiconductor layer, and a second electrode disposed under the second window layer and electrically connected to the second conductive semiconductor layer.

Advantageous Effects

A light emitting device, a light emitting device package and a light unit according to embodiments can improve light extraction efficiency.

A light emitting device, a light emitting device package and a light unit according to embodiments can decrease an operating voltage and improve reliability A light emitting device, a light emitting device package and a light unit according to embodiments can decrease an operating voltage and improve luminosity.

BEST MODE

In the following description of the embodiments, it will be understood that, when each layer (film), area, pattern or structure is referred to as being formed "on" or "under" a substrate or each layer (film), area, pad, pattern or structure, it can be directly "on" or "under" a substrate or each layer (film), area, pad or pattern or be indirectly formed with one or more intervening layers therebetween. In addition, it will also be understood that "on" or "under" the layer may mean an upward direction and a downward direction of the layer.

Hereinafter, a light emitting device, a light emitting device package, a light unit and a method of manufacturing a light emitting device according to embodiments will be described in detail with reference to the accompanying drawings.

Figure 1:
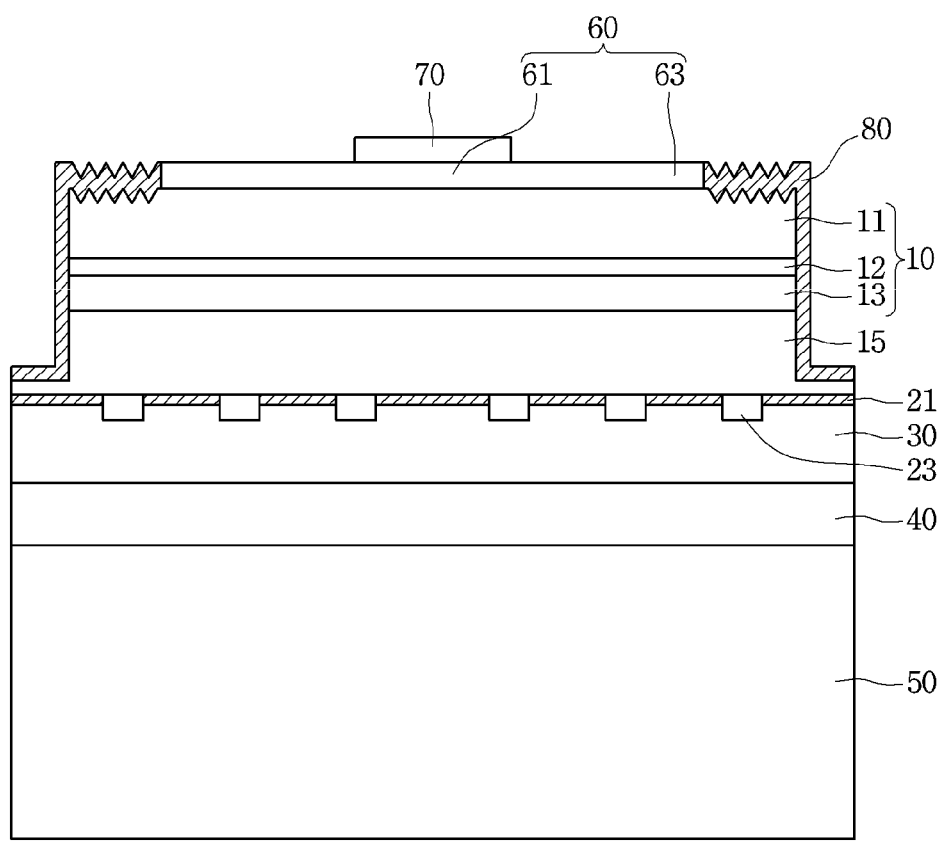
FIG. 1 is a view showing a light emitting device according to an embodiment.

FIG. 1 is a view showing a light emitting device according to an embodiment.

The light emitting device according to the embodiment may include a light emitting structure 10, a first electrode 60, an electrode pad 70 and a protective layer 80, as shown in FIG. 1.

The light emitting structure 10 may include a first conductive semiconductor layer 11, an active layer 12, a second conductive semiconductor layer 13. The active layer 12 may be disposed between the first conductive semiconductor layer 11 and the second conductive semiconductor layer 13. The active layer 12 may be disposed under the first conductive semiconductor layer 11 and the second conductive semiconductor layer 13 may be disposed under the active layer 12.

As an example, the first conductive semiconductor layer 11 may be formed as an n-type semiconductor layer doped with an n-type dopant as a first conductive dopant and the second conductive semiconductor layer 13 may be formed as a p-type semiconductor layer doped with a p-type dopant as a second conductive dopant. Alternatively, the first conductive semiconductor layer 11 may be formed as a p-type semiconductor layer and the second conductive semiconductor layer 13 may be formed as an n-type semiconductor layer.

The first conductive semiconductor layer 11 may include an n-type semiconductor layer, for example. The first conductive semiconductor layer 11 may be implemented by compound semiconductors. The first conductive semiconductor layer 11 may be implemented by compound semiconductors of Group II-VI elements or compound semiconductors of Group III-V elements, for example.

For example, the first conductive semiconductor layer 11 may be implemented by a semiconductor material of a formula of $(Al_xGa_{1-x})_yIn_{1-y}P(0 \leq x \leq 1, 0 \leq y \leq 1)$. In the formula of the first conductive semiconductor layer 11, y may have a value of 0.5 and x may have a value of 0.5 to 0.8. The first conductive semiconductor layer 11 may be selected from among AlGaInP, AlInP, GaP, GaInP, etc. and may be doped with an n-type dopant such as Si, Ge, Sn, Se or Te.

The active layer 12 emits light by an energy band gap difference caused by materials of the active layer 12 by coupling electrons (holes) injected through the first conductive semiconductor layer 11 and holes (electrons) injected through the second conductive semiconductor layer 13. The active layer 12 may be formed in any one of a single well structure, a multi well structure, a quantum dot structure or a quantum wire structure, without being limited thereto.

The active layer 12 may be implemented by compound semiconductors. The active layer 12 may be implemented by compound semiconductors of Group II-VI elements or Group III-V elements, for example. The active layer 12 may be implemented by a semiconductor material having a formula of $(Al_xGa_{1-x})_yIn_{1-y}P(0 \leq x \leq 1, 0 \leq y \leq 1)$, for example. The active layer 12 may be selected from among AlGaInP, AlInP, GaP, GaInP, etc. If the active layer 12 is implemented in a multi well structure, the active layer 12 may be implemented by laminating a plurality of well layers and a plurality of barrier layers.

The second conductive semiconductor layer 13 may be implemented by a p-type semiconductor layer, for example. The second conductive semiconductor layer 13 may be implemented by compound semiconductors. The second conductive semiconductor layer 13 may be implemented by compound semiconductors of Group II-VI elements or Group III-V elements, for example.

For example, the second conductive semiconductor layer 13 may be implemented by a semiconductor material having a formula of $(Al_xGa_{1-x})_yIn_{1-y}P(0 \leq x \leq 1, 0 \leq y \leq 1)$. The second conductive semiconductor layer 13 may be selected from among AlGaInP, AlInP, GaP, GaInP, etc. and may be doped with a p-type dopant such as Mg, Zn, Ca, Sr, Ba or C.

For example, the light emitting structure 10 may include at least two elements selected from among aluminum (Al), gallium (Ga), indium (In) and phosphorus (P).

Meanwhile, the first conductive semiconductor layer 11 may include a p-type semiconductor layer and the second conductive semiconductor layer 13 may include an n-type semiconductor layer. In addition, a semiconductor layer including an n-type or p-type semiconductor layer may be further formed under the second conductive semiconductor layer 13. The light emitting structure 10 may have at least one of np, pn, npn and pnp junction structures. In addition, the doping concentration of the impurities in the first conductive semiconductor layer 11 and the second conductive semiconductor layer 13 may be uniformly or ununiform. That is, the structure of the light emitting structure 10 may be various, without being limited thereto.

The light emitting device according to the embodiment may include a window layer 15. The window layer 15 may be implemented by a semiconductor material having a formula of $(Al_xGa_{1-x})_yIn_{1-y}P(0 \leq x \leq 1, 0 \leq y \leq 1)$. The window layer 15 may be selected from among AlGaInP, AlInP, GaP, GaInP, etc., for example. The window layer 15 may be disposed under the second conductive semiconductor layer 13. The window layer 15 may provide current spreading effects.

The light emitting device according to the embodiment may include an omni directional reflector (ODR) 21, an ohmic contact layer 23 and a reflective layer 30.

The ODR layer 21 may perform a function for reflecting light incident from the upper side thereof upwardly. The ODR layer 21 may have a lower refractive index than the light emitting structure 10, for example. The ODR layer 21 may have a low refractive index which is significantly different from that of the material forming the light emitting structure 10, thereby providing a reflective function. The ODR layer 21 may be disposed to contact the window layer 15.

The ODR layer 21 may include oxide or nitride. The ODR layer 21 may include at least one selected from among $SiO_2$, $SiN_x$, Indium-Tin-Oxide (ITO), Indium-Zinc-Oxide (IZO), Aluminum-Zinc-Oxide (AZO), Antimony-Tin-Oxide (ATO), Indium-Zinc-Tin-Oxide (IZTO), Indium-Aluminum-Zinc-Oxide (IAZO), Gallium-Zinc-Oxide (GZO), Indium-Gallium-Zinc-Oxide (IGZO), Indium-Gallium-Tin-Oxide (IGTO), Aluminum-Zinc-Oxide (AZO), etc.

The ohmic contact layer 23 may be implemented to ohmically contact the window layer 15. The ohmic contact layer 23 may include an area ohmically contacting the window layer 15. The ohmic contact layer 23 may be electrically connected to the light emitting structure 10. The ohmic contact layer 23 may penetrate through the ODR layer 21. For example, the ohmic contact layer 23 may have an upper surface having a circular or elliptical shape. The ohmic contact layer 23 may include at least one selected from Au, Au/AuBe/Au, AuZn, ITO, AuBe, GeAu, etc.

The reflective layer 30 may be disposed under the ohmic contact layer 23. The reflective layer 30 may be disposed under the ODR layer 21. The reflective layer 30 may perform a function for reflecting light incident from the upper side thereof upwardly. The reflective layer 30 may include at least one selected from among Ag, Au, Al, etc., for example.

The light emitting device according to the embodiment may include a bonding layer 40 and a support substrate 50. The bonding layer 40 may perform a function for attaching the reflective layer 30 and the support substrate 50.

The bonding layer 40 may include at least one selected from among Sn, AuSn, Pd, Al, Ti, Au, Ni, Cr, Ga, In, Bi, Cu, Ag, Nb, Ta, Ti/Au/In/Au, etc. The support substrate 50 may include at least one selected from among semiconductor substrates (e.g., Si, Ge, GaN, GaAs, ZnO, SiC, SiGe, etc.), into which Ti, Cr, Ni, Al, Pt, Au, W, Cu, Mo, Cu—W or impurities are injected.

The light emitting structure according to the embodiment may include the first electrode 60, the electrode pad 70 and the protective layer 80 disposed on the light emitting structure 10.

The first electrode 60 may be electrically connected to the first conductive semiconductor layer 11. The first electrode 60 may be disposed to contact the first conductive semiconductor layer 11. The first electrode 60 may be disposed to ohmically contact the first conductive semiconductor layer 11. The first electrode 60 may have an area ohmically contacting the light emitting structure 10. The first electrode 60 may include an area ohmically contacting the first conductive semiconductor layer 11. The first electrode 60 may include at least one selected from among Ge, Zn, Mg, Ca, Au, Ni, AuGe, AuGe/Ni/Au, etc.

The light emitting device according to the embodiment may further include a high-concentration impurity semiconductor layer disposed between the first electrode 60 and the first conductive semiconductor layer 11. For example, the high-concentration impurity semiconductor layer may be implemented by a GaAs layer. The high-concentration impurity semiconductor layer may include impurities having the same polarity as the first conductive semiconductor layer 11. The high-concentration impurity semiconductor layer may include impurities having higher concentration than the first conductive semiconductor layer 11.

The electrode pad 70 may be electrically connected to the first electrode 60. The electrode pad 70 may be disposed on the first electrode 60. The electrode pad 70 may be disposed to contact the first electrode 60. The electrode pad 70 may be connected to an external power supply to provide a voltage to the light emitting structure 10. The first electrode pad 70 may include at least one selected from among Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc.

According to the embodiment, the protective layer 80 may be disposed on the light emitting structure 10. The protective layer 80 may be disposed around the light emitting structure 10. The protective layer 80 may be disposed on the side surface of the light emitting structure 10. The protective layer 80 may be disposed around the window layer 15. Some areas of the protective layer 80 may be disposed on some areas of the window layer 15.

The protective layer 80 may include at least one of oxide or nitride. The protective layer 80 may be formed of at least one selected from a group including $SiO_2$, $Si_xO_y$, $Si_3N_4$, $Si_xN_y$, $SiO_xN_y$, $Al_2O_3$, $TiO_2$, AlN, etc.

Figure 2:
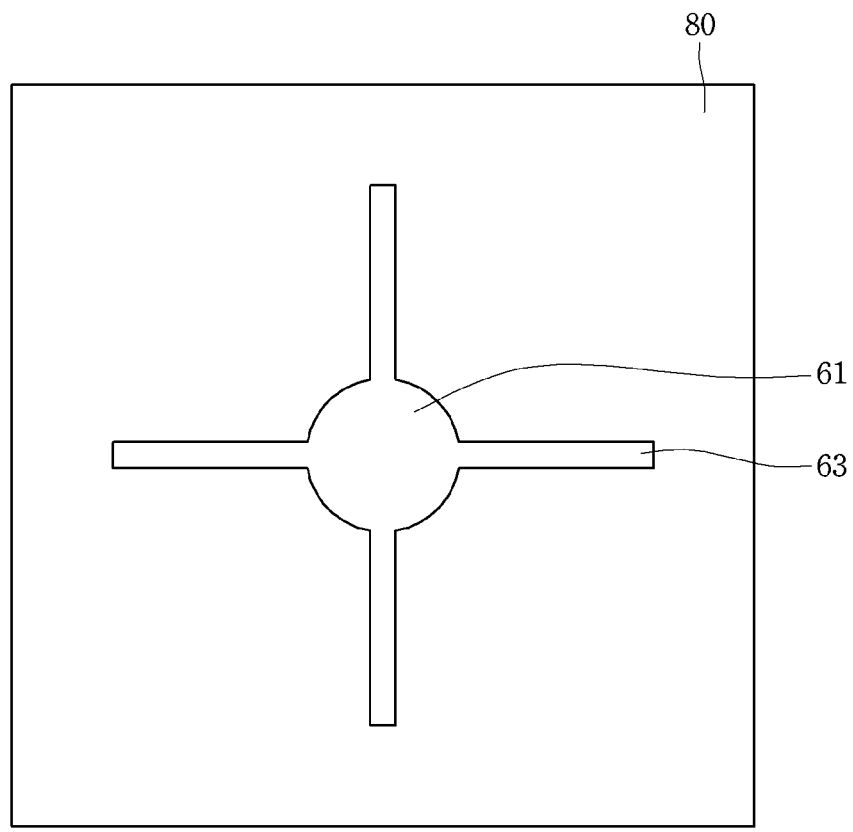
FIG. 2 is a view showing an example of a first electrode applied to the light emitting device according to the embodiment.
Figure 3:
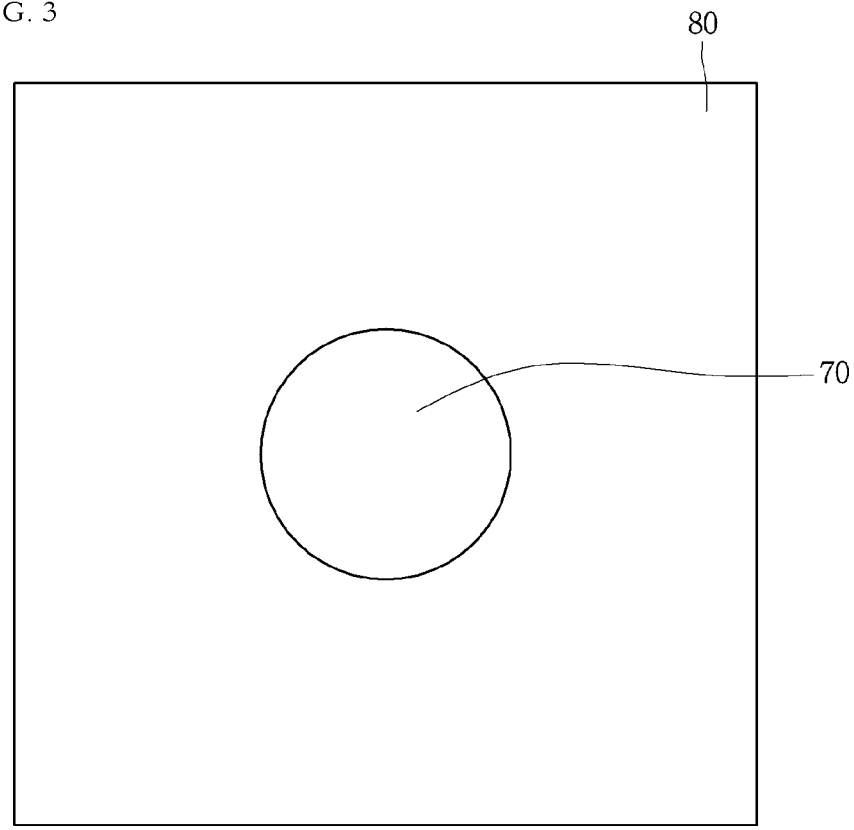
FIG. 3 is a view showing an example of an electrode pad applied to the light emitting device according to the embodiment.

FIG. 2 is a plan view showing an example of the first electrode 60 applied to the light emitting device according to the embodiment, and FIG. 3 is a plan view showing an example of the electrode pad 70 applied to the light emitting device according to the embodiment.

The first electrode 60 according to the embodiment may be disposed on the light emitting structure 10. The first electrode 60 may include a main electrode 61 and a peripheral electrode 63. For example, the main electrode 61 may be disposed in the center area of the upper surface of the light emitting structure 10 and the peripheral electrode 63 may be branched from the main electrode 651 to extend outwardly. For example, the width of the peripheral electrode 63 may be 4 to 5 micrometers. The main electrode 61 may include a circular or polygonal upper surface.

The first electrode 60 may be electrically connected to the first conductive semiconductor layer 11. The main electrode 61 may be electrically connected to the first conductive semiconductor layer 11. The peripheral electrode 63 may be electrically connected to the first conductive semiconductor layer 11.

According to the embodiment, the electrode pad 70 may be disposed at a position corresponding to the main electrode 61. The electrode pad 70 may include a circular or polygonal upper surface.

The electrode pad 70 may be electrically connected to the first electrode 60. The electrode pad 70 may be electrically connected to the main electrode 61. The electrode pad 70 may be electrically connected to the peripheral electrode 63.

According to the embodiment, the electrode pad 70 may be disposed on the main electrode 61. The electrode pad 70 may be disposed to contact the main electrode 61. For example, the area of the electrode pad 70 may be greater than that of the main electrode 61. If the area of the electrode pad 70 is greater than that of the main electrode 61, the protective layer 80 may be disposed under the electrode pad 70.

According to the embodiment, the protective layer 80 may be disposed on the light emitting structure 10. The protective layer 80 may be disposed on the first conductive semiconductor layer 11. The first conductive semiconductor layer 11 may include a light extraction structure provided on the upper surface thereof. The light extraction structure may be referred to as an uneven structure. In addition, the light extraction structure may be referred to as roughness. The protective layer 80 may include a light extraction structure corresponding to the light extraction structure provided on the first conductive semiconductor layer 11.

The protective layer 80 may include a penetration area. The first electrode 60 may be disposed in the penetration area. For example, the main electrode 61 and the peripheral electrode 63 may be provided in the penetration area formed in the protective layer 60. The electrode pad 70 may be electrically connected to the first electrode 60, a first area of the electrode pad 70 may be disposed on the first electrode 70 and a second area may be disposed on the protective layer 80.

According to the embodiment, the area of the electrode pad 70 may be greater than that of the main electrode 61. The first area of the electrode pad 70 may be disposed on the main electrode 61 to contact the main electrode 61 and the second area of the electrode pad 70 may be disposed around the upper portion of the main electrode 61 to be disposed on the protective layer 80.

The refractive index of the protective layer 80 disposed under the electrode pad 70 may be less than that of the first conductive semiconductor layer 11. Accordingly, the protective layer 80 disposed under the electrode pad 70 may perform the function of the ODR layer and light incident from the light emitting structure 10 may be reflected from the protective layer 80 to be propagated toward the light emitting structure 10 again.

According to the embodiment, the refractive index of the protective layer 80 disposed under the electrode pad 70 may be less than that of the protective layer 80 of an area in which the electrode pad 70 is not disposed. The material of the protective layer 80 disposed under the electrode pad 70 may be different from that of the protective layer 80 of the area in which the electrode pad 70 is not disposed. For example, the protective layer 80 disposed under the electrode pad 80 may include oxide and the protective layer 80 of the area in which the electrode pad 80 is not disposed may include nitride.

In this implementation, the protective layer 80 disposed under the electrode pad 70 may perform the function of the ODR layer to reflect light incident from the light emitting structure 10 and the protective layer 80 of the area in which the electrode pad 70 is not disposed may penetrate light incident from the light emitting structure 10 outwardly.

According to the embodiment, the light incident from the light emitting structure 10 may be prevented from penetrating through the protective layer 80 to be absorbed into the electrode pad 70. Therefore, the light reflected from the protective layer 80 disposed under the electrode pad 70 may be propagated toward the light emitting structure 10 and the propagated light may penetrate through the light emitting structure 10 or reflect from the light emitting structure 10 in other directions to be extracted, thereby improving light extraction effects of the light emitting device according to the embodiment.

According to the embodiment, the disposition structure of the main electrode 61 and the peripheral electrode 63 may be variously changed. In addition, the disposition structure of the electrode pad 70 may be variously changed in correspondence with the disposition structure of the main electrode 61 and the peripheral electrode 63.

According to the embodiment, as shown in FIG. 1, the support substrate 50 may have conductivity and a voltage may be applied to the light emitting structure 10 by an external power supply connected to the support substrate 50.

The voltage may be applied to the second conductive semiconductor layer 13 through the support substrate 50.

In addition, according to the embodiment, the second electrode electrically connected to the second conductive semiconductor layer 13 may include at least one of the ohmic contact layer 23, the reflective layer 30, the bonding layer 40 and the support substrate 50.

A method of manufacturing a light emitting device according to an embodiment will be described with reference to FIGS. 4 to 7.

Figure 4:
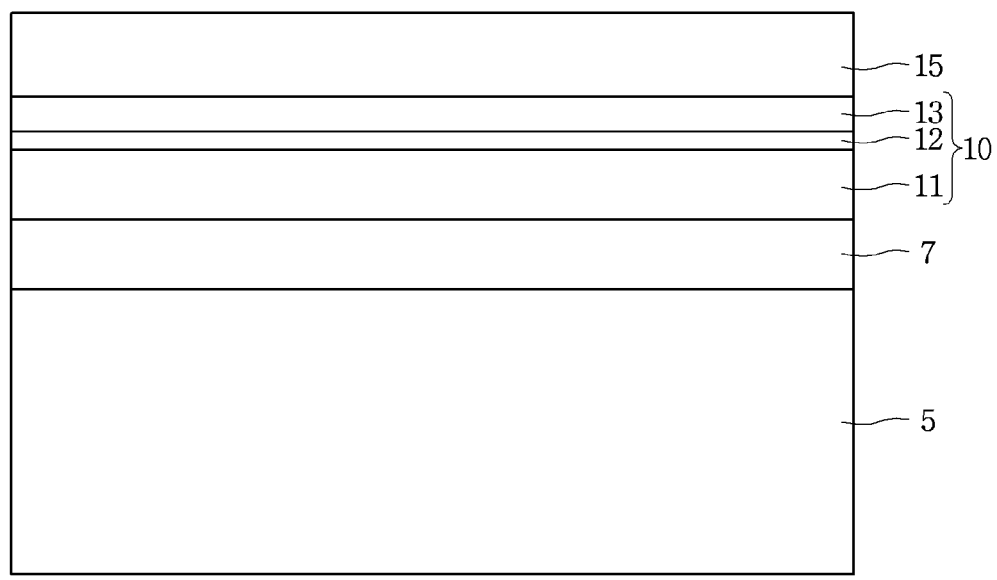
FIGS. 4 to 7 are views illustrating a method of manufacturing a light emitting device according to an embodiment.

According to the method of manufacturing the light emitting device of the embodiment, as shown in FIG. 4, an etch stop layer 7, a first conductive semiconductor layer 11, an active layer 12, a second conductive semiconductor layer 13 and a window layer 15 may be formed on a substrate 5. The first conductive semiconductor layer 11, the active layer 12 and the second conductive semiconductor layer 13 may be referred to as a light emitting structure 10.

The substrate 5 may be formed of, for example, at least one of sapphire ($Al_2O_3$), SiC, GaAs, GaN, ZnO, Si, GaP, InP, Ge, etc., without being limited thereto. A buffer layer may be further formed between the substrate 5 and the etch stop layer 7.

The etch stop layer 7 may be implemented by a semiconductor material having a formula of $(Al_xGa_{1-x})_yIn_{1-y}P$ ($0 \leq x \leq 1$, $0 \leq y \leq 1$), for example. The function of the etch stop layer 7 will be described later.

According to the embodiment, the first conductive semiconductor layer 11 may be formed of an n-type semiconductor layer doped with an n-type dopant as a first conductive dopant and the second conductive semiconductor layer 13 may be formed of a p-type semiconductor layer doped with a p-type dopant as a second conductive dopant. In addition, the first conductive semiconductor layer 11 may be formed of a p-type semiconductor layer and the second conductive semiconductor layer 13 may be formed of an n-type semiconductor layer.

The first conductive semiconductor layer 11 may include an n-type semiconductor layer, for example. The first conductive semiconductor layer 11 may be implemented by compound semiconductors. The first conductive semiconductor layer 11 may be implemented by compound semiconductors of Group II-VI elements or Group III-V elements, for example.

For example, the first conductive semiconductor layer 11 may be implemented by a semiconductor layer having a formula of $(Al_xGa_{1-x})_yIn_{1-y}P$ ($0 \leq x \leq 1$, $0 \leq y \leq 1$). In the formula of the first conductive semiconductor layer 11, y may have a value of 0.5 and x may have a value of 0.5 to 0.8. The first conductive semiconductor layer 11 may be selected from among AlGaInP, AlInP, GaP, GaInP, etc. and may be doped with an n-type dopant such as Si, Ge, Sn, Se or Te.

The active layer 12 emits light by an energy band gap difference caused by materials of the active layer 12 by coupling electrons (holes) injected through the first conductive semiconductor layer 11 and holes (electrons) injected through the second conductive semiconductor layer 13. The active layer 12 may be formed in any one of a single well structure, a multi well structure, a quantum dot structure or a quantum wire structure, without being limited thereto.

The active layer 12 may be implemented by compound semiconductors. The active layer 12 may be implemented by compound semiconductors of Group II-VI elements or Group III-V elements, for example. The active layer 12 may be implemented by a semiconductor material having a formula of $(Al_xGa_{1-x})_yIn_{1-y}P$ ($0 \leq x \leq 1$, $0 \leq y \leq 1$), for example. The active layer 12 may be selected from among AlGaInP, AlInP, GaP, GaInP, etc. If the active layer 12 is implemented in a multi well structure, the active layer 12 may be implemented by laminating a plurality of well layers and a plurality of barrier layers.

The second conductive semiconductor layer 13 may be implemented by a p-type semiconductor layer, for example. The second conductive semiconductor layer 13 may be implemented by compound semiconductors. The second conductive semiconductor layer 13 may be implemented by compound semiconductors of Group II-VI elements or Group III-V elements, for example.

For example, the second conductive semiconductor layer 13 may be implemented by a semiconductor material having a formula of $(Al_xGa_{1-x})_yIn_{1-y}P(0 \leq x \leq 1, 0 \leq y \leq 1)$. The second conductive semiconductor layer 13 may be selected from among AlGaInP, AlInP, GaP, GaInP, etc., for example, and may be doped with a p-type dopant such as Mg, Zn, Ca, Sr, Ba or C.

For example, the light emitting structure 10 may include at least two elements selected from among aluminum (Al), gallium (Ga), indium (In) and phosphorus (P).

The window layer 15 may be implemented by a semiconductor material having a formula of $(Al_xGa_{1-x})_yIn_{1-y}P$ $(0 \leq x \leq 1, 0 \leq y \leq 1)$. The window layer 15 may be selected from among AlGaInP, AlInP, GaP, GaInP, etc., for example. The window layer 15 may provide current spreading effects upon driving the light emitting device.

Figure 5:
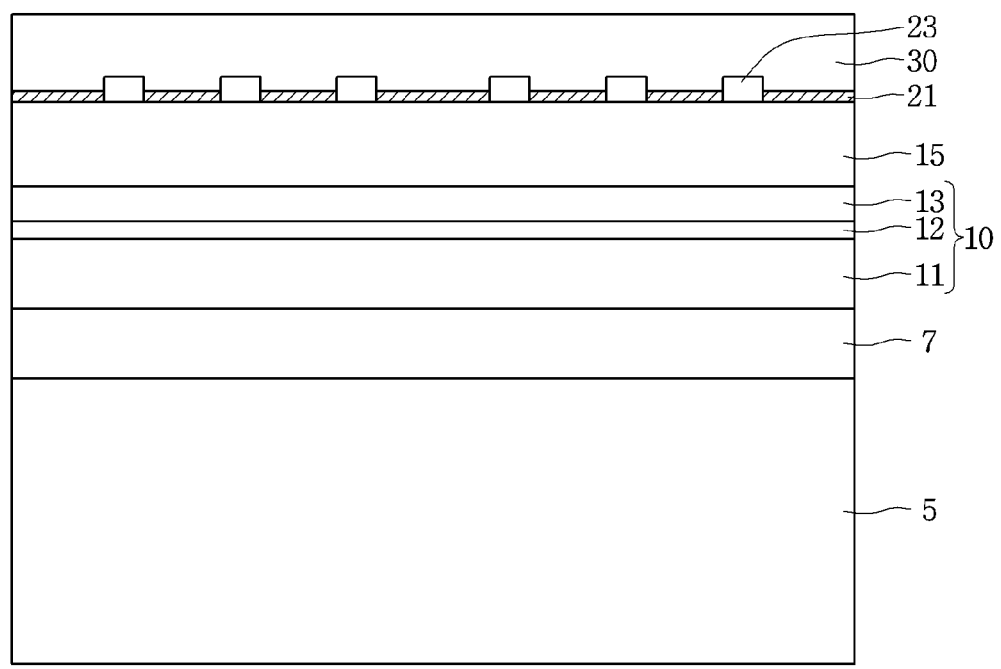

Next, as shown in FIG. 5, the ODR layer 21, the ohmic contact layer 23 and the reflective layer 30 may be formed on the window layer 15.

The ODR layer 21 may perform a function for reflecting incident light again. The ODR layer 21 may have a lower refractive index than the light emitting structure 10. The ODR layer 21 may have a low refractive index which is significantly different from that of the material forming the light emitting structure 10, thereby providing a reflective function. The ODR layer 21 may be disposed to contact the window layer 15.

The ODR layer 21 may include oxide or nitride. The ODR layer 21 may include at least one selected from among $SiO_2$, $SiN_x$, Indium-Tin-Oxide (ITO), Indium-Zinc-Oxide (IZO), Aluminum-Zinc-Oxide (AZO), Antimony-Tin-Oxide (ATO), Indium-Zinc-Tin-Oxide (IZTO), Indium-Aluminum-Zinc-Oxide (IAZO), Gallium-Zinc-Oxide (GZO), Indium-Gallium-Zinc-Oxide (IGZO), Indium-Gallium-Tin-Oxide (IGTO), Aluminum-Zinc-Oxide (AZO), etc.

The ohmic contact layer 23 may be implemented to ohmically contact the window layer 15. The ohmic contact layer 23 may include an area ohmically contacting the window layer 15. The ohmic contact layer 23 may be electrically connected to the light emitting structure 10. The ohmic contact layer 23 may be disposed to penetrate through the ODR layer 21. For example, the ohmic contact layer 23 may have an upper surface having a circular or elliptical shape. The ohmic contact layer 23 may include at least one selected from Au, Au/AuBe/Au, AuZn, ITO, AuBe, GeAu, etc.

The reflective layer 30 may be disposed on the ohmic contact layer 23. The reflective layer 30 may be disposed on the ODR layer 21. The reflective layer 30 may perform a function for reflecting incident light again. The reflective layer 30 may include at least one selected from among Ag, Au, Al, etc., for example.

Figure 6:
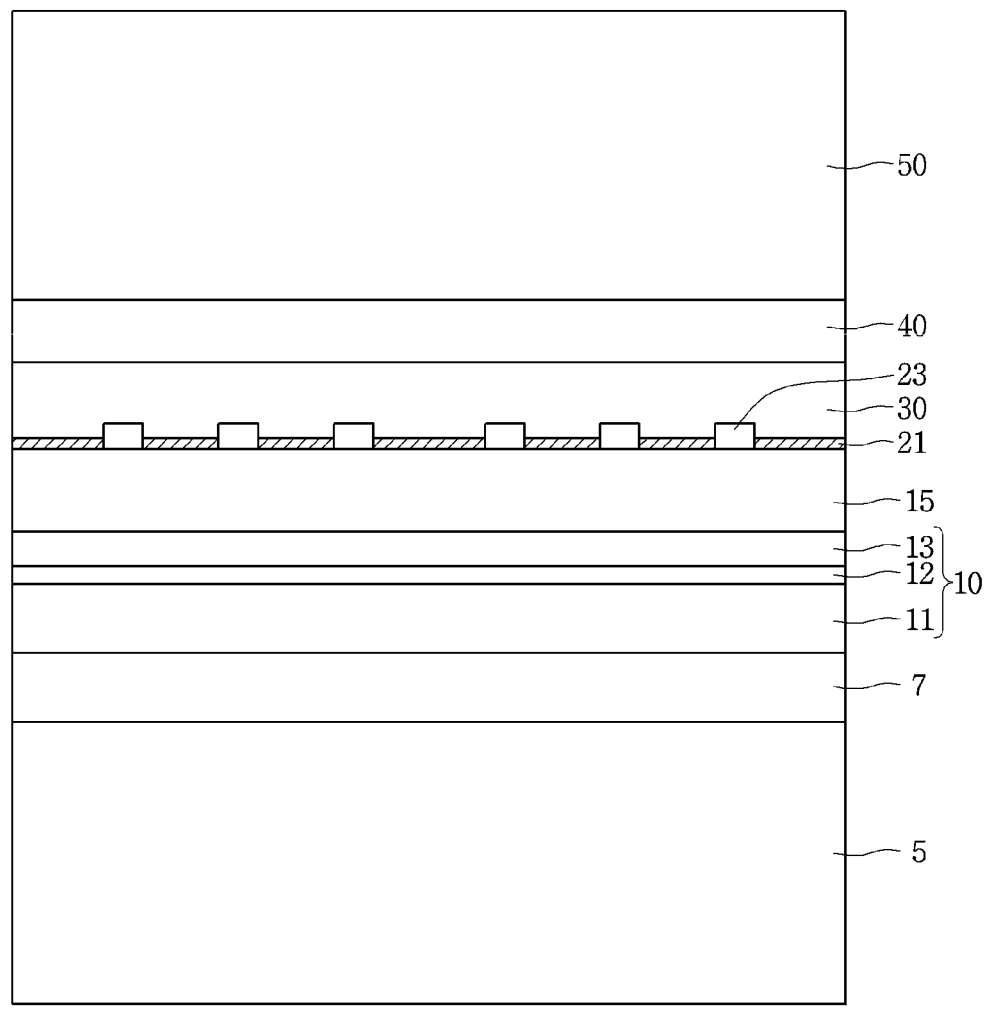

Subsequently, as shown in FIG. 6, the boding layer 40 and the support substrate 50 may be provided on the reflective layer 30.

The bonding layer 40 may perform a function for attaching the reflective layer 30 and the support substrate 50. The bonding layer 40 may include at least one selected from among Sn, AuSn, Pd, Al, Ti, Au, Ni, Cr, Ga, In, Bi, Cu, Ag, Nb, Ta, Ti/Au/In/Au, etc. The support substrate 50 may include at least one selected from among semiconductor substrates (e.g., Si, Ge, GaN, GaAs, ZnO, SiC, SiGe, etc.), into which Ti, Cr, Ni, Al, Pt, Au, W, Cu, Mo, Cu—W or impurities are injected.

Next, the substrate 5 is removed from the etch stop layer 7. For example, the substrate 5 may be removed through an etching process. If the substrate 5 is implemented by GaAs, the substrate 5 may be removed through a wet etching process and the etch stop layer 7 may not be etched to perform the function of the stop layer such that only the substrate 5 is etched and removed. The etch stop layer 7 may be removed from the light emitting structure 10 through a separate removal process. For example, the etch stop layer 7 may be removed through a separate etching process. The etch stop layer 7 may be implemented by a semiconductor material having a formula of $(Al_xGa_{1-x})_yIn_{1-y}P$ $(0 \leq x \leq 1, 0 \leq y \leq 1)$, for example.

Figure 7:
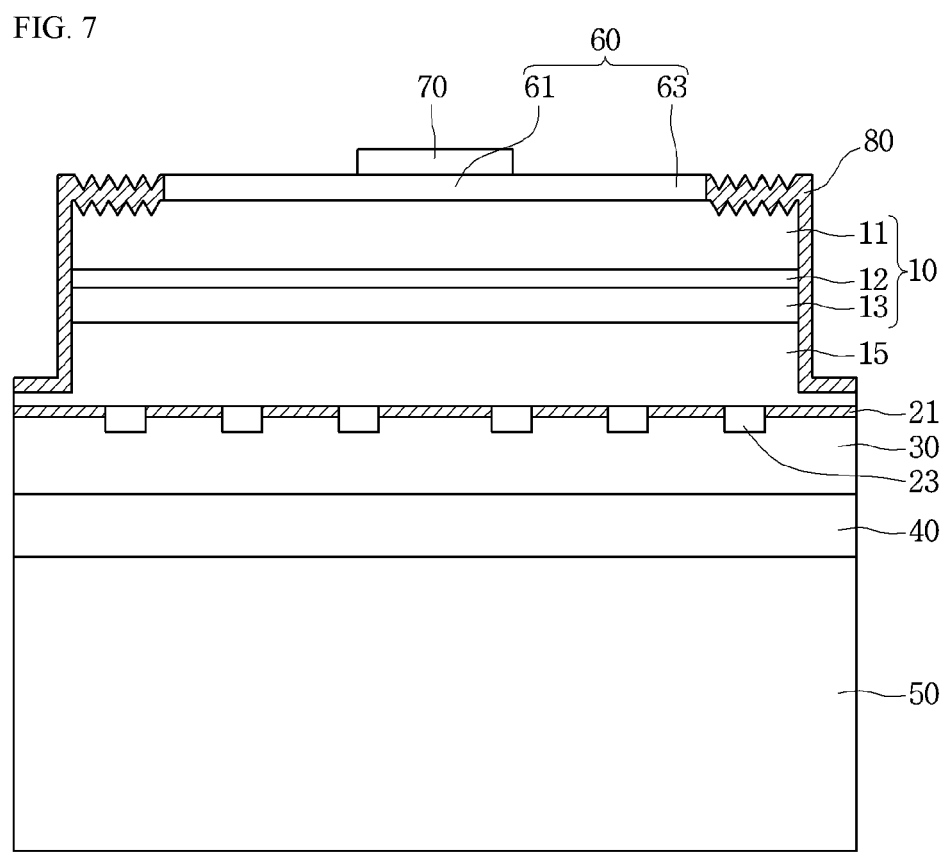

Subsequently, as shown in FIG. 7, the first electrode 60 may be formed on the light emitting structure 10 and a light extraction structure may be formed on the first conductive semiconductor layer 11. Next, isolation etching may be performed to etch the side surface of the light emitting structure 10. A protective layer 80 and an electrode pad 70 may be formed on the light emitting structure 10.

The first electrode 60 according to the embodiment may be disposed on the light emitting structure 10. The first electrode 60 may include a main electrode 61 and a peripheral electrode 63. For example, as shown in FIGS. 2 and 7, the main electrode 61 may be disposed in the center area of the upper surface of the light emitting structure 10 and the peripheral electrode 63 may be branched from the main electrode 651 to extend outwardly. For example, the width of the peripheral electrode 63 may be 4 to 5 micrometers. The main electrode 61 may include a circular or polygonal upper surface.

The first electrode 60 may be electrically connected to the first conductive semiconductor layer 11. The main electrode 61 may be electrically connected to the first conductive semiconductor layer 11. The peripheral electrode 63 may be electrically connected to the first conductive semiconductor layer 11.

According to the embodiment, as shown in FIGS. 3 and 7, the electrode pad 70 may be disposed at a position corresponding to the main electrode 61. The electrode pad 70 may include a circular or polygonal upper surface.

The electrode pad 70 may be electrically connected to the first electrode 60. The electrode pad 70 may be electrically connected to the main electrode 61. The electrode pad 70 may be electrically connected to the peripheral electrode 63.

According to the embodiment, the electrode pad 70 may be disposed on the main electrode 61. The electrode pad 70 may be disposed to contact the main electrode 61. For example, the area of the electrode pad 70 may be greater than that of the main electrode 61. If the area of the electrode pad 70 is greater than that of the main electrode 61, the protective layer 80 may be disposed under the electrode pad 70.

According to the embodiment, the protective layer 80 may be disposed on the light emitting structure 10. The protective layer 80 may be disposed on the first conductive semiconductor layer 11. The first conductive semiconductor layer 11 may include a light extraction structure provided on the upper surface thereof. The light extraction structure may be referred to as an uneven structure. In addition, the light extraction structure may be referred to as roughness. The protective layer 80 may include a light extraction structure corresponding to the light extraction structure provided on the first conductive semiconductor layer 11.

The protective layer 80 may include a penetration area. The first electrode 60 may be disposed in the penetration area. The electrode pad 70 may be electrically connected to the first electrode 60, a first area of the electrode pad 70 may be disposed on the first electrode 70 and a second area may be disposed on the protective layer 80.

According to the embodiment, the area of the electrode pad 70 may be greater than that of the main electrode 61. The first area of the electrode pad 70 may be disposed on the main electrode 61 to contact the main electrode 61 and the second area of the electrode pad 70 may be disposed around the upper portion of the main electrode 61 to be disposed on the protective layer 80.

The refractive index of the protective layer 80 disposed under the electrode pad 70 may be less than that of the first conductive semiconductor layer 11. Accordingly, the protective layer 80 disposed under the electrode pad 70 may perform the function of the ODR layer and light incident from the light emitting structure 10 may be reflected from the protective layer 80 to be propagated toward the light emitting structure 10 again.

According to the embodiment, the refractive index of the protective layer 80 disposed under the electrode pad 70 may be less than that of the protective layer 80 of an area in which the electrode pad 70 is not disposed. The material of the protective layer 80 disposed under the electrode pad 70 may be different from that of the protective layer 80 of the area in which the electrode pad 70 is not disposed. For example, the protective layer 80 disposed under the electrode pad 80 may include oxide and the protective layer 80 of the area in which the electrode pad 80 is not disposed may include nitride.

In this implementation, the protective layer 80 disposed under the electrode pad 70 may perform the function of the ODR layer to reflect light incident from the light emitting structure 10 and the protective layer 80 of the area in which the electrode pad 70 is not disposed may penetrate light incident from the light emitting structure 10 outwardly.

According to the embodiment, the light incident from the light emitting structure 10 may be prevented from penetrating through the protective layer 80 to be absorbed into the electrode pad 70. Therefore, the light reflected from the protective layer 80 disposed under the electrode pad 70 may be propagated toward the light emitting structure 10 and the propagated light may penetrate through the light emitting structure 10 or reflect from the light emitting structure 10 in other directions to be extracted, thereby improving light extraction effects.

According to the embodiment, the disposition structure of the main electrode 61 and the peripheral electrode 63 may be variously changed. In addition, the disposition structure of the electrode pad 70 may be variously changed in correspondence with the disposition structure of the main electrode 61 and the peripheral electrode 63.

Figure 8:
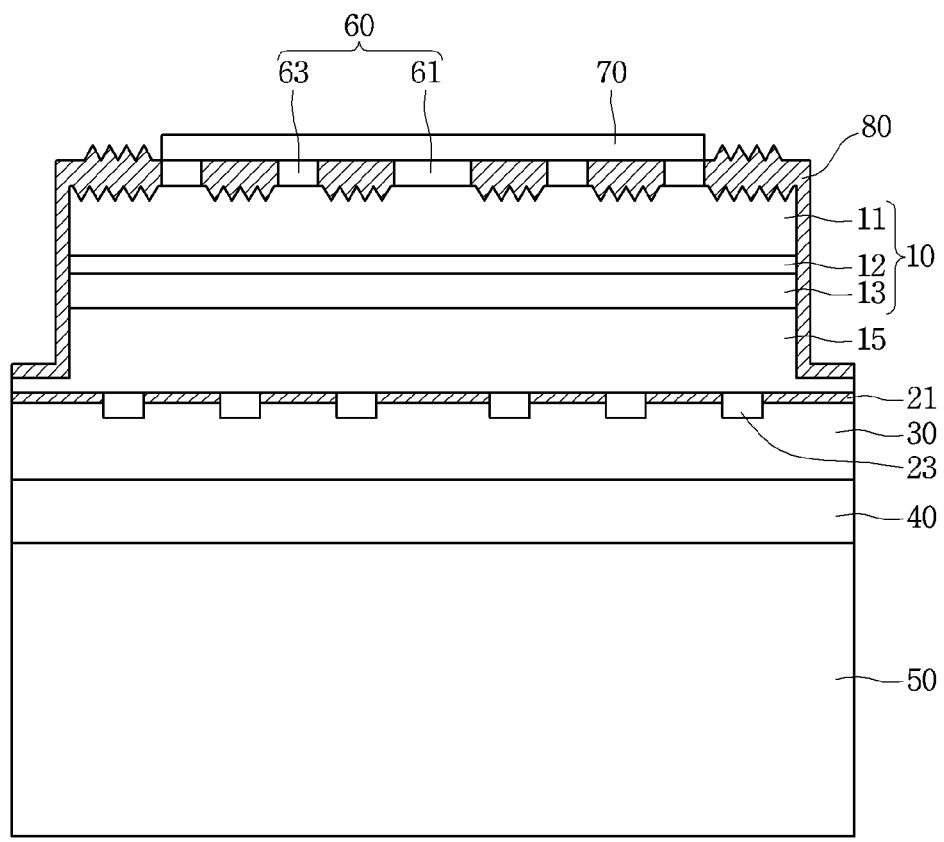
FIG. 8 is a view showing another example of a light emitting device according to the embodiment.

FIG. 8 is a view showing another example of a light emitting device according to the embodiment. In the description of the light emitting device according to the embodiment with respect to FIG. 8, the portions described with reference to FIGS. 1 to 7 will be briefly described or omitted.

The light emitting device according to the embodiment may include a light emitting structure 10, a first electrode 60, an electrode pad 70 and a protective layer, as shown in FIG. 8.

Figure 9:
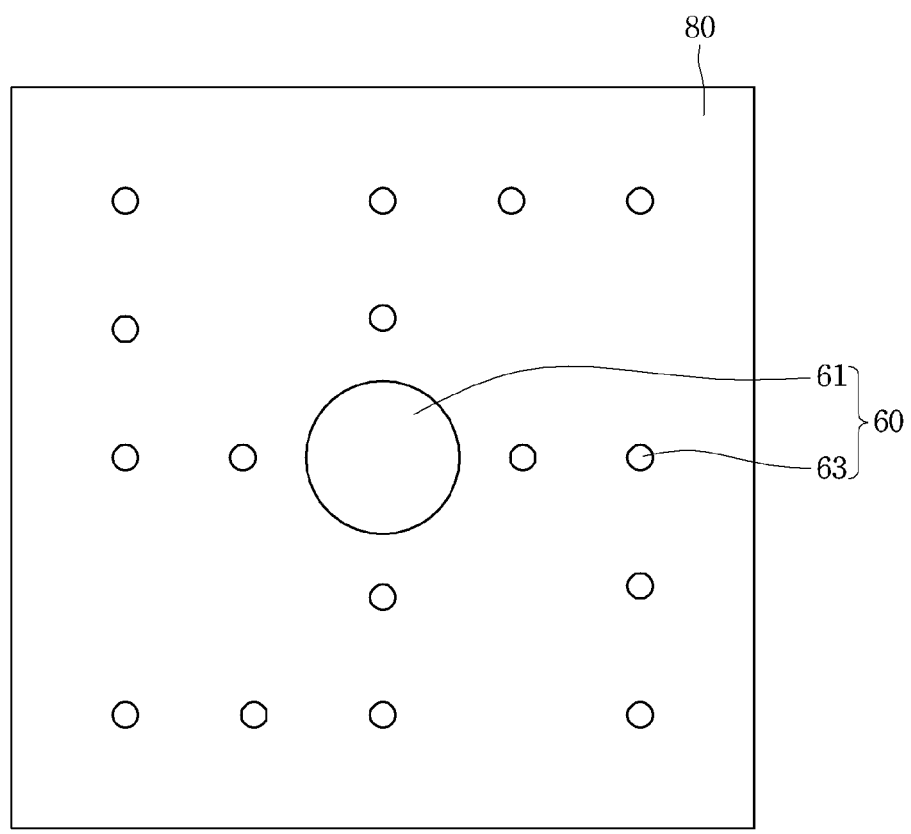
FIG. 9 is a view showing an example of a first electrode applied to the light emitting device shown in FIG. 8.

The first electrode 60 according to the embodiment may be disposed on the light emitting structure 10. The first electrode 60 may include a main electrode 61 and a peripheral electrode 63, as shown in FIGS. 8 and 9. The main electrode 61 and the peripheral electrode 63 may be disposed on the light emitting structure 10 to be spaced apart from each other. A plurality of peripheral electrodes 63 may be provided.

The main electrode 61 and the peripheral electrode 63 may be formed in a dot shape. The sizes of the main electrode 61 and the peripheral electrodes 63 may be equal or different. The peripheral electrode 63 may be provided in the form of a plurality of dots having different sizes. For example, the size of the peripheral electrode 63 located far from the main electrode 61 may have a smaller size than the other peripheral electrodes. The width of the peripheral electrode 63 may be 4 to 5 micrometers. The main electrode 61 and the peripheral electrode 63 may include a circular or polygonal upper surface.

The first electrode 60 may be electrically connected to the first conductive semiconductor layer 11. The main electrode 61 may be electrically connected to the first conductive semiconductor layer 11. The peripheral electrode 63 may be electrically connected to the first conductive semiconductor layer 11.

Figure 10:
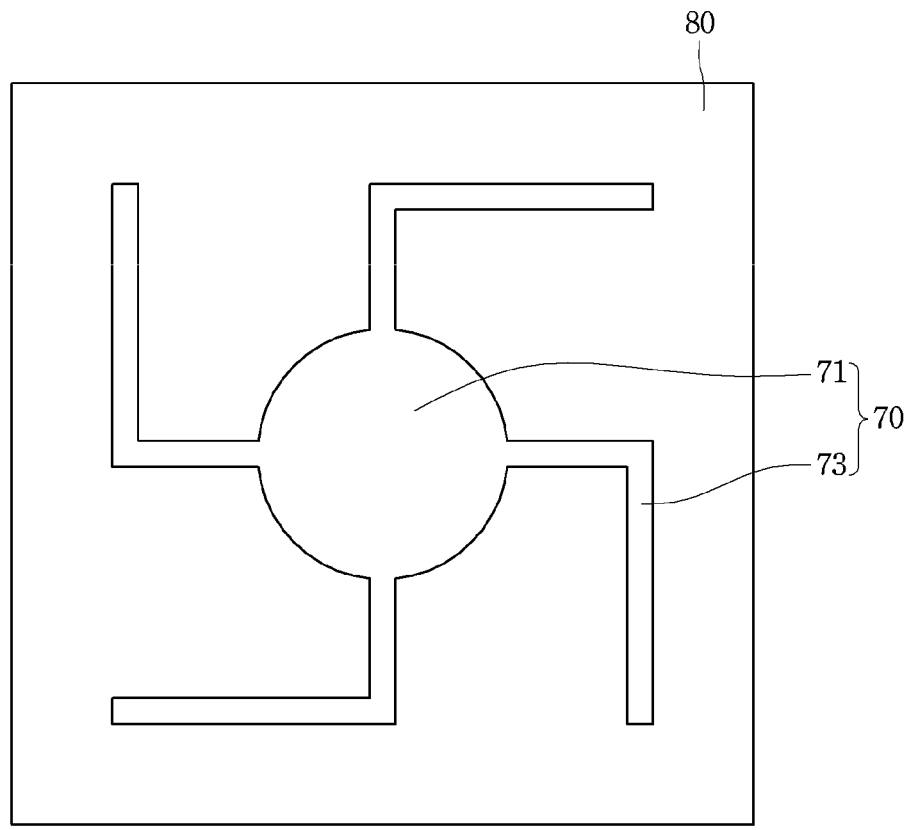
FIG. 10 is a view showing an example of an electrode pad applied to the light emitting device shown in FIG. 8.

According to the embodiment, the electrode pad 70 may include a main pad 71 and a finger pad 73, as shown in FIGS. 8 and 10. The finger pad 73 may be electrically connected to the main pad 71. The finger pad 73 may be branched from the main pad 71. For example, a voltage may be applied from an external power supply to the main pad 71. The finger pad 73 may extend from the main pad 71 outwardly. The finger pad 73 may be provided in a symmetrical structure. The finger pad 73 may be provided in asymmetrical structure.

The electrode pad 70 may be electrically connected to the first electrode 60. The electrode pad 70 may be electrically connected to the main electrode 61. The electrode pad 70 may be electrically connected to the peripheral electrodes 63.

According to the embodiment, the electrode pad 70 may be disposed on the main electrode 61. The electrode pad 70 may be disposed to contact the main electrode 61. For example, the area of the electrode pad 70 may be greater than that of the main electrode 61. If the area of the electrode pad 70 is greater than that of the main electrode 61, the protective layer 80 may be disposed under the electrode pad 70.

According to the embodiment, the protective layer 80 may be disposed on the light emitting structure 10. The protective layer 80 may be disposed on the first conductive semiconductor layer 11. The first conductive semiconductor layer 11 may include a light extraction structure provided on the upper surface thereof. The light extraction structure may be referred to as an uneven structure. In addition, the light extraction structure may be referred to as roughness. The protective layer 80 may include a light extraction structure corresponding to the light extraction structure provided on the first conductive semiconductor layer 11.

The finger pad 73 may be disposed on the peripheral electrode 63. The finger pad 73 may be disposed to contact the peripheral electrode 63. The finger pad 73 may be disposed to contact the peripheral electrode 63. The finger pad 73 may be disposed to contact the plurality of peripheral electrodes 63. The finger pad 73 may electrically connect the main electrode 61 and at least one peripheral electrode 63. The finger pad 73 may electrically connect the plurality of peripheral electrodes 63.

For example, the first electrode 60 may include a first area (the main electrode or one of the peripheral electrodes 63) and a second area (another of the peripheral electrodes 63) spaced apart from each other and the electrode pad 70 may be electrically connected to the first area and the second area.

The width of the finger pad 73 may be equal to or different from that of the peripheral electrode 63. For example, the width of the finger pad 73 may be 4 to 5 micrometers.

The protective layer 80 may include a plurality of through-holes. The main electrode 61 and the peripheral electrode 63 may be provided in the through-holes. The size of the through-hole may be equal to that of the main electrode 61 or the peripheral electrodes 63 corresponding thereto. For example, the width of the through-holes may be 4 to 5 micrometers.

According to the embodiment, the first electrode 60 may be provided in each of the through-holes to include a plurality of metal dots electrically connected to the first conductive semiconductor layer 11. The protective layer 80 may be disposed around the first electrode 60 provided in the form of the plurality of dots. Some areas of the protective layer 80 may be disposed under the electrode pad 70. For example, the protective layer 80 provided between adjacent peripheral electrodes 63 may be disposed under the finger pad 73. In addition, if the area of the main pad 71 is greater than that of the main electrode 61, the protective layer 80 may be disposed under the main pad 71. That is, the protective layer 80 may be disposed between the main pad 71 and the first conductive semiconductor layer 11.

The electrode pad 70 may electrically connect the plurality of metal dots configuring the first electrode 60. A first area of the electrode pad 70 may be disposed on the first electrode 60 and a second area of the electrode pad 70 may be disposed on the protective layer 80.

According to the embodiment, the first electrode 60 may include a plurality of areas spaced apart from one another and the plurality of areas spaced apart from one another may be electrically connected by the electrode pad 70. An external power supply connected to the electrode pad 70 applies a voltage to the main electrode 61 and the peripheral electrode 63 through the main pad 71 and the finger pad 73. Thus, the external power supply connected to the electrode pad 70 may apply the voltage to the first conductive semiconductor layer 11 through the first electrode 60.

According to the embodiment, the disposition structure of the main electrode 61 and the peripheral electrode 63 may be variously changed. In addition, the disposition structure of the main pad 71 and the finger pad 73 may be variously changed in correspondence with the disposition structure of the main electrode 61 and the peripheral electrode 63.

The main electrode 61 and the peripheral electrode 63 form an ohmic contact with the first conductive semiconductor layer 11. In general, an ohmic contact between a metal layer and a semiconductor layer may be implemented by forming the metal layer on the semiconductor layer and performing a heat treatment process. At this time, a diffusion area is formed between the metal layer and a semiconductor layer through the heat treatment process. In the diffusion area, light absorption occurs. Therefore, as the size of the diffusion area increases, light extraction effect from the light emitting structure decreases.

Figure 11:
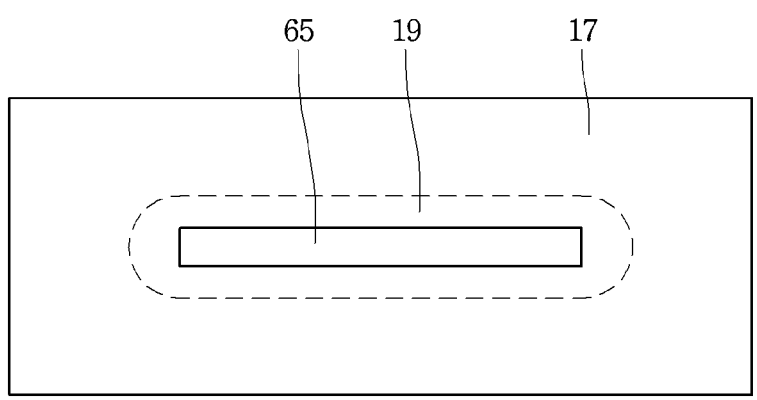
FIGS. 11 to 14 are views illustrating a difference between an ohmic contact area applied to the light emitting device according to the embodiment and an ohmic contact area applied to a conventional light emitting device.
Figure 12:
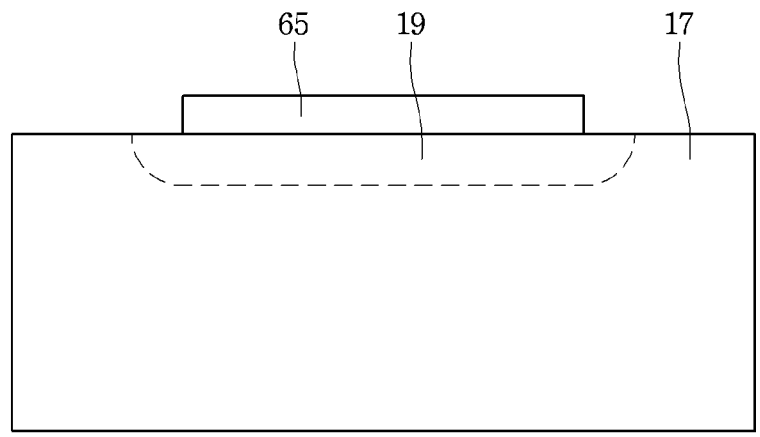
Figure 13:
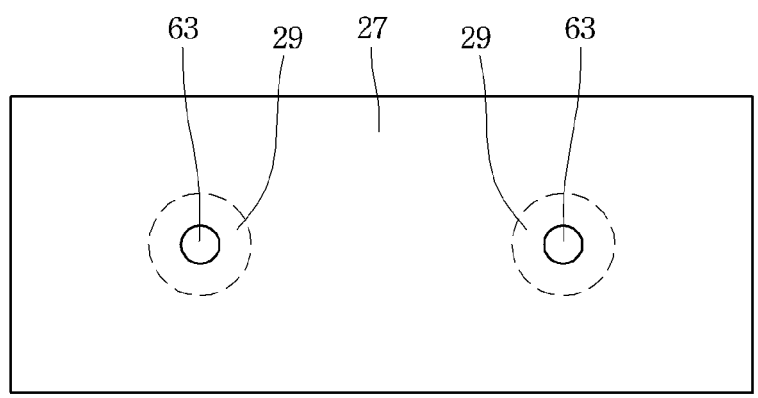
Figure 14:
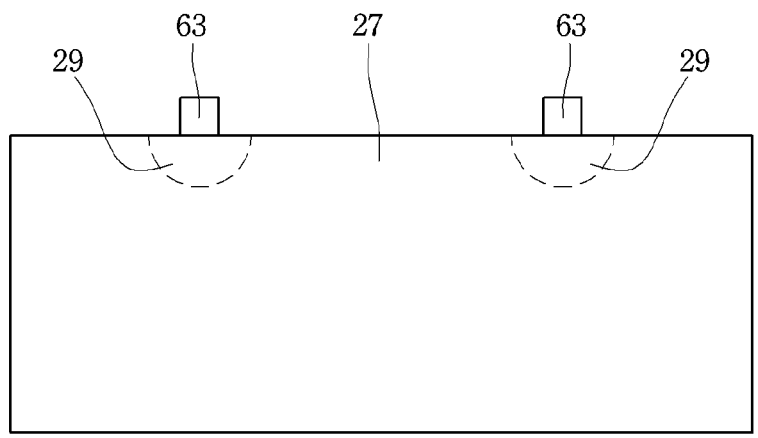

FIGS. 11 and 12 show an ohmic contact area applied to a conventional light emitting device and FIGS. 13 and 14 show an ohmic contact area applied to a light emitting device according to an embodiment.

In the conventional light emitting device, as shown in FIGS. 11 and 12, a diffusion area 19 may be provided between a metal layer 65 having a predetermined length and a semiconductor layer 17. At this time, the diffusion area 19 is diffused and formed around and under the metal layer 65.

In contrast, in the light emitting device according to the embodiment, as shown in FIGS. 13 and 14, a diffusion area 29 may be provided between a plurality of metal dots 63 and a semiconductor layer 27. At this time, as the plurality of metal dots 63 occupies a small area, the diffusion area 29 forms a small area. According to the embodiment, upon forming an ohmic contact area, since the diffusion area 29 may be small, it is possible to reduce the amount of light absorbed in the diffusion area 29 and, as a result, to increase the amount of extracted light.

According to the light emitting device of the embodiment, the first electrode 60 includes the main electrode 61 and the peripheral electrode 63 spaced apart from each other, such that the first electrode 60 provides, on the light emitting structure 10, a smaller area than the conventional light emitting device.

Accordingly, the light emitting device according to the embodiment can improve light extraction efficiency. In addition, the main electrode 61 and the peripheral electrode 63 are uniformly distributed on the first conductive semiconductor layer 11, thereby providing current spreading effect.

The refractive index of the protective layer 80 disposed under the electrode pad 70 may be less than that of the first conductive semiconductor layer 11. Therefore, the protective layer 80 disposed under the electrode pad 70 may perform the function of the ODR layer and light incident from the light emitting structure 10 may be reflected from the protective layer 80 to be propagated toward the light emitting structure 10 again.

According to the embodiment, the refractive index of the protective layer 80 disposed under the electrode pad 70 may be less than that of the protective layer 80 of the region in which the electrode pad 70 is not disposed. The material of the protective layer 80 disposed under the electrode pad 70 may be different from that of the protective layer 80 of the area in which the electrode pad 70 is not disposed. For example, the protective layer 80 disposed under the electrode pad 80 may include oxide and the protective layer 80 of the area in which the electrode pad 80 is not disposed may include nitride.

In this implementation, the protective layer 80 disposed under the electrode pad 70 may perform the function of the ODR layer to reflect light incident from the light emitting structure 10 and the protective layer 80 of the area in which the electrode pad 70 is not disposed may penetrate light incident from the light emitting structure 10 outwardly.

According to the embodiment, the light incident from the light emitting structure 10 may be prevented from penetrating through the protective layer 80 to be absorbed into the electrode pad 70. Therefore, the light reflected from the protective layer 80 disposed under the electrode pad 70 may be propagated toward the light emitting structure 10 and the propagated light may penetrate through the light emitting structure 10 or reflect from the light emitting structure 10 in other directions to be extracted outwardly, thereby improving light extraction effects.

According to the embodiment, the disposition structure of the main electrode 61 and the peripheral electrode 63 may be variously changed. In addition, the disposition structure of the electrode pad 70 may be variously changed in correspondence with the disposition structure of the main electrode 61 and the peripheral electrode 63.

According to the embodiment, as shown in FIG. 8, the support substrate 50 may have conductivity and a voltage may be applied to the light emitting structure 10 by an external power supply connected to the support substrate 50. The voltage may be applied to the second conductive semiconductor layer 13 through the support substrate 50.

In addition, according to the embodiment, the second electrode electrically connected to the second conductive semiconductor layer 13 may include at least one of the ohmic contact layer 23, the reflective layer 30, the bonding layer 40 and the support substrate 50.

Figure 15:
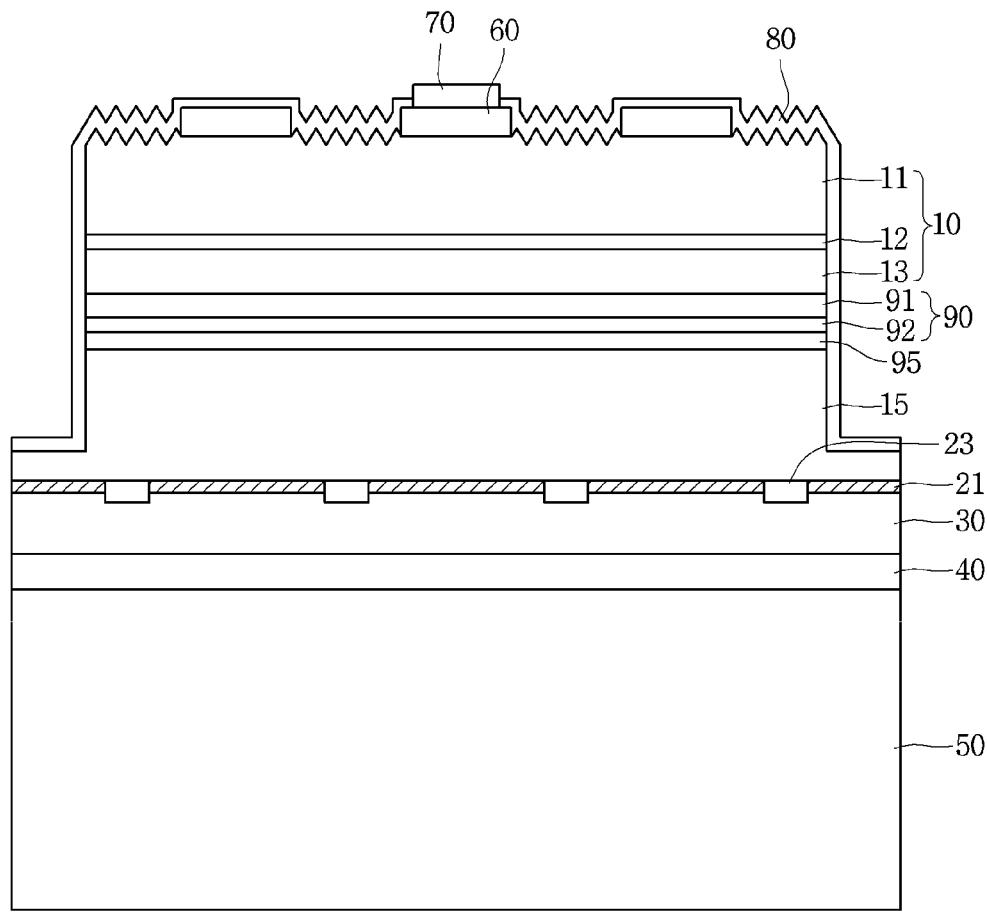
FIG. 15 is a view showing a light emitting device according to an embodiment.

FIG. 15 is a view showing a light emitting device according to an embodiment.

The light emitting device according to the embodiment may include a light emitting structure 10, a window layer 15, an energy buffer layer 90 and a tensile strain barrier layer 95, as shown in FIG. 15. The components shown in FIG. 1 will be omitted.

The energy buffer layer 90 may be disposed under the light emitting structure 10. The energy buffer layer 90 may include impurities. The energy buffer layer 90 may include impurities having the same polarity as the second conductive semiconductor layer, for example. The energy buffer layer 90 may include an area, the energy band gap of which is changed according to the distance from the light emitting structure 10. FIG. 2 is a view showing the energy band gap of the semiconductor layer applied to the light emitting device according to the embodiment.

Figure 16:
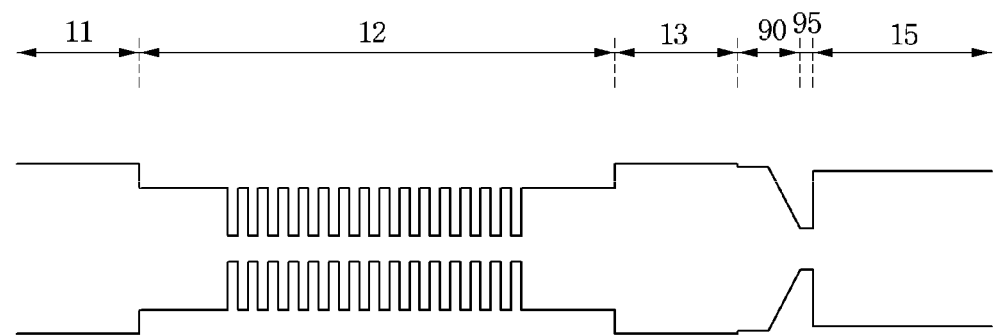
FIG. 16 is a view showing an energy band gap of a semiconductor layer applied to the light emitting device according to the embodiment.

As shown in FIGS. 15 and 16, the energy buffer layer 90 may include a first area 91 and a second area 92. The energy band gap of the first area 91 may be constant regardless of change in distance from the light emitting structure 10. The energy band gap of the second area 92 may be gradually decreased according to the distance from the first area 91.

The tensile strain barrier layer 95 may be disposed under the energy buffer layer 90. The tensile strain barrier layer 95 may be disposed under the second area 92. The tensile strain barrier layer 95 may have an energy band gap equal to or less than that of the energy buffer layer 90. The tensile strain barrier layer 95 may have an energy band gap less than or equal to that of the second area 92. The tensile strain barrier layer 95 may include impurities. For example, the tensile strain barrier layer 95 may include impurities having the same polarity as the second conductive semiconductor layer 13.

The window layer 15 may be disposed under the tensile strain barrier layer 95. For example, the thickness of the energy buffer layer 90 may be 180 to 250 nanometers. The thickness of the first area 91 may be 170 to 230 nanometers and the thickness of the first area 92 may be 10 to 20 nanometers.

In addition, the thickness of the energy buffer layer 90 may be greater than that of the tensile strain barrier layer 95. For example, the thickness of the tensile strain barrier layer 95 may be 10 to 20 nanometers.

The light emitting device according to the embodiment may include a first electrode 60 and an electrode pad 70 disposed on the light emitting structure 10.

The first electrode 60 may be electrically connected to the first conductive semiconductor layer 11. The first electrode 60 may be disposed to contact the first conductive semiconductor layer 11. The first electrode 60 may be disposed to ohmically contact the first conductive semiconductor layer 11. The first electrode 60 may have an area ohmically contacting the light emitting structure 10. The first electrode 60 may have an area ohmically contacting the first conductive semiconductor layer 11. The first electrode 60 may include at least one selected from among Ge, Zn, Mg, Ca, Au, Ni, AuGe, AuGe/Ni/Au, etc.

A high-concentration impurity semiconductor layer disposed between the first electrode 60 and the first conductive semiconductor layer 11 may be further included. For example, a GaAs layer including high-concentration impurities having a higher impurity concentration than the first conductive semiconductor layer 11 may be further disposed between the first electrode 60 and the first conductive semiconductor layer 11.

The electrode pad 70 may be electrically connected to the first electrode 60. The electrode pad 70 may be disposed on the first electrode 60. The electrode pad 70 may be disposed to contact the first electrode 60. The electrode pad 70 may be connected to an external power supply to provide a voltage to the light emitting structure 10. The first electrode pad 70 may include at least one selected from among Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc.

The light emitting device according to the embodiment may include a protective layer 80. The protective layer 80 may be disposed on the light emitting structure 10. The protective layer 80 may be disposed around the light emitting structure 10. The protective layer 80 may be disposed on the side surface of the light emitting structure 10. The protective layer 80 may be disposed around the window layer 15. Some areas of the protective layer 80 may be disposed on some areas of the window layer 15.

The protective layer 80 may be disposed on the first conductive semiconductor layer 11. The protective layer 80 may be disposed on the first electrode 60. The protective layer 80 may include a light extraction structure provided on the upper surface thereof. The light extraction structure may be referred to as an uneven structure. In addition, the light extraction structure may be referred to as roughness. The light extraction structure may be regularly or randomly arranged. The light extraction stricture provided on the upper surface of the protective layer 80 correspond to the light extraction structure provided on the upper surface of the first conductive semiconductor layer 11.

The protective layer 80 may include at least one of oxide or nitride. The protective layer 80 may be formed of at least one selected from a group including $SiO_2$, $Si_3O_y$, $Si_3N_4$, $Si_xN_y$, $SiO_xN_y$, $Al_2O_3$, $TiO_2$, AlN, etc.

The light emitting device according to the embodiment may further include the tensile strain barrier layer 95 in order to prevent the light emitting structure 10 from being damaged. The tensile strain barrier layer 95 may be formed of a material having tensile strain force between a growth substrate and the window layer 15. For example, the tensile strain barrier layer 95 may be provided as a GaInP layer.

Since the tensile strain barrier layer 95 has a low energy band gap, loss may occur in movement of holes to the active layer 12. In consideration of this, the light emitting device according to the embodiment may further include the energy buffer layer 90, the energy band gap of which is changed according to the distance from the light emitting structure 10.

For example, the energy buffer layer 90 may include AlGaINP composition. The energy band gap of the energy buffer layer 90 may be changed according to change in composition ratio of Al. The first area 91 may be provided such that the composition ratio of Al is constant. The energy band gap of the second area 92 may be decreased as the second area 92 becomes far from the first area 91. The composition ratio of Al may be gradually decreased such that the energy band gap of the second area 92 is decreased as the second area 92 becomes far from the first area 91.

For example, the first area 91 may include $(Al_xGa_{(1-x)})_{0.5}In_{0.5}P$ (x=0.85) composition and the second area 92 may include $(Al_xGa_{(1-x)})_{0.5}In_{0.5}P$ (0.85≤x≤0.3) composition. The composition ratio of Al in a portion of the second area 92 adjacent to the first area is 0.85 and is gradually decreased as the second area becomes far from the first area 91, thereby being decreased to up to 0.3.

By sequentially changing the energy band gap of the energy buffer layer 90, it is possible to prevent holes moving from the window layer 15 to the active layer 12 from being lost.

According to the embodiment, an operating voltage can be reduced by improving movement of holes. For example, a light emitting device without the energy buffer layer 90 has an operating voltage of 2.24 V and a light emitting device having the energy buffer layer 90 has an operating voltage of 1.96 V.

For example, the first conductive semiconductor layer 11 may be implemented by $Al_{0.5}In_{0.5}P$ (energy band gap: 2.52 eV), the active layer 12 may be implemented by a well layer of $(Al_{0.1}Ga_{0.9})_{0.5}In_{0.5}P$ (energy band gap: 1.97 eV) and a barrier layer of $(Al_{0.7}Ga_{0.3})_{0.5}In_{0.5}P$ (energy band gap: 2.34 eV), and the second conductive semiconductor layer 13 may be implemented by $Al_{0.5}In_{0.5}P$ (energy band gap: 2.52 eV).

The first area 91 of the energy buffer layer 90 may be implemented by $(Al_{0.85}Ga_{0.15})_{0.5}In_{0.5}P$ (energy band gap: 2.43 eV) and the second area 92 of the energy buffer layer 90 may be implemented such that the composition ratio of Al is gradually decreased from $(Al_{0.85}Ga_{0.15})_{0.5}In_{0.5}P$ (energy band gap: 2.43 eV) to $(Al_{0.3}Ga_{0.7})_{0.5}In_{0.5}P$ (energy band gap: 2.09 eV).

According to the embodiment, the lowest energy band gap of the energy buffer layer 90 may be greater than the energy band gap of the well layer forming the active layer 12 and less than the energy band gap of the window layer 15. In addition, the energy band gap of the tensile strain barrier layer 95 may be greater than that of the well layer forming the active layer 12 and less than that of the window layer 15. If a semiconductor layer having a lower energy band gap than the well layer forming the active layer 12 is present, light absorption occurs therein to prevent light loss.

Then, a method of manufacturing a light emitting device according to an embodiment will be described with reference to FIGS. 17 to 20.

Figure 17:
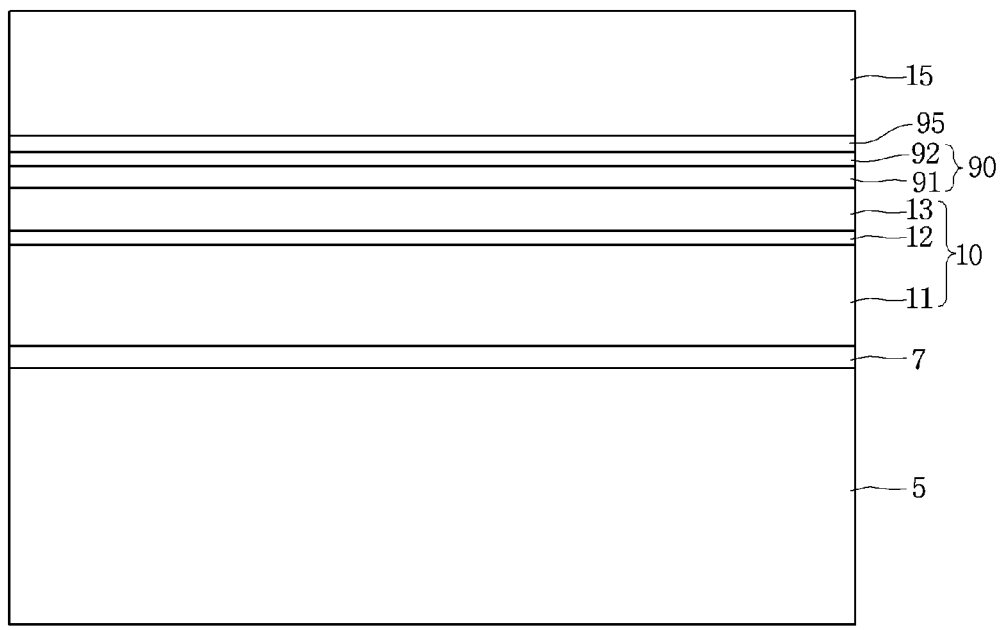
FIGS. 17 to 20 are views showing a method of manufacturing a light emitting device according to an embodiment.

According to the method of manufacturing the light emitting device of the embodiment, as shown in FIG. 17, an etch stop layer 7, a first conductive semiconductor layer 11, an active layer 121, a second conductive semiconductor layer 13, an energy buffer layer 90, a tensile strain barrier layer 95 and a window layer 15 may be formed on a substrate 5. The first conductive semiconductor layer 11, the active layer 12 and the second conductive semiconductor layer 13 may be defined as a light emitting structure 10.

The energy buffer layer 90 may be formed on the light emitting structure 10. The energy buffer layer 90 may include an area, the energy band gap of which is changed according to the distance from the light emitting structure 10. FIG. 16 is a view showing the energy band gap of the semiconductor layer applied to the light emitting device according to the embodiment.

As shown in FIGS. 16 and 17, the energy buffer layer 90 may include a first area 91 and a second area 92. The energy band gap of the first area 91 may be constant regardless of change in distance from the light emitting structure 10. The energy band gap of the second area 92 may be gradually decreased according to the distance from the first area 91.

The tensile strain barrier layer 95 may be formed on the energy buffer layer 90. The tensile strain barrier layer 95 may be formed on the second area 92. The tensile strain barrier layer 95 may have an energy band gap less than or equal to that of the energy buffer layer 90. The tensile strain barrier layer 95 may have an energy band gap less than or equal to that of the second area 92.

Figure 18:
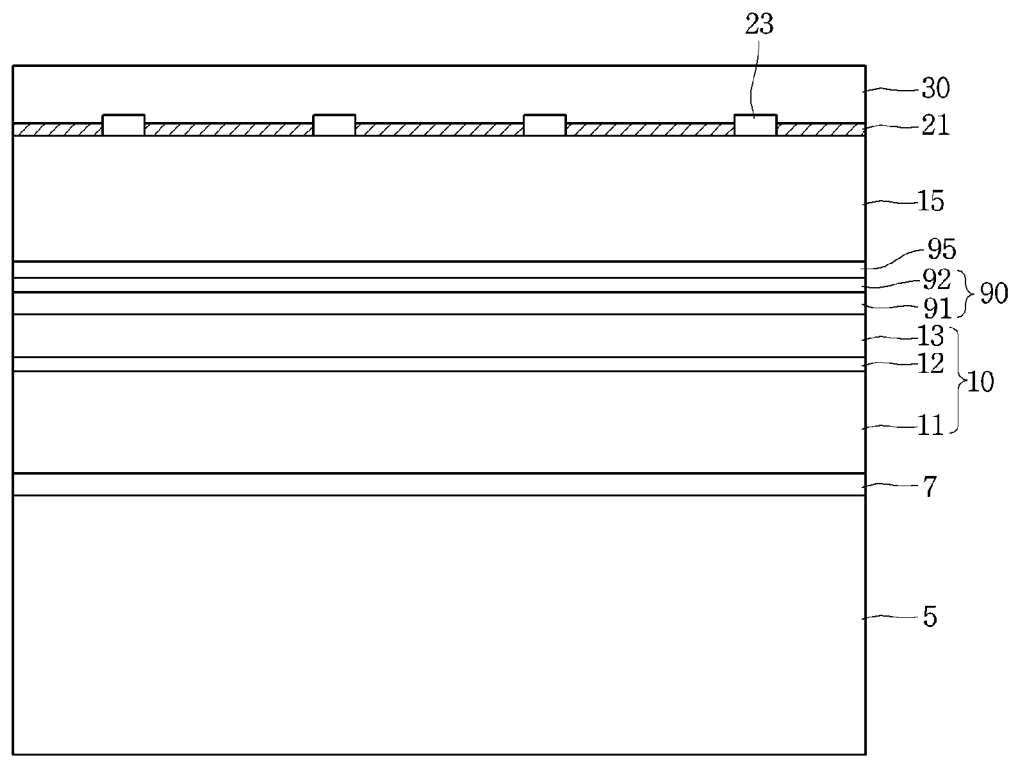

Next, as shown in FIG. 18, an ODR layer 21, an ohmic contact layer 23 and a reflective layer 30 may be formed on the window layer 15.

Figure 19:
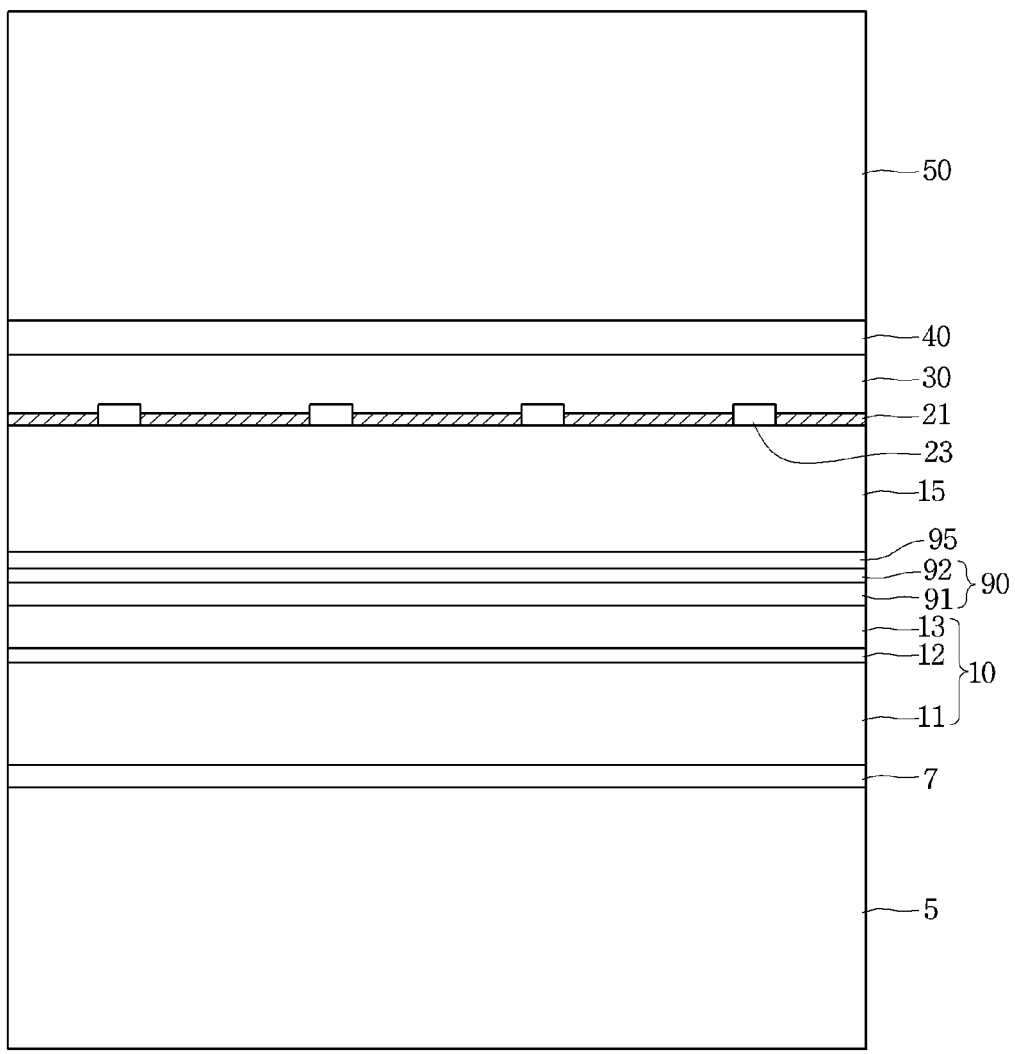

Subsequently, as shown in FIG. 19, a bonding layer 40 and a support substrate 50 may be provided on the reflective layer 30.

Figure 20:
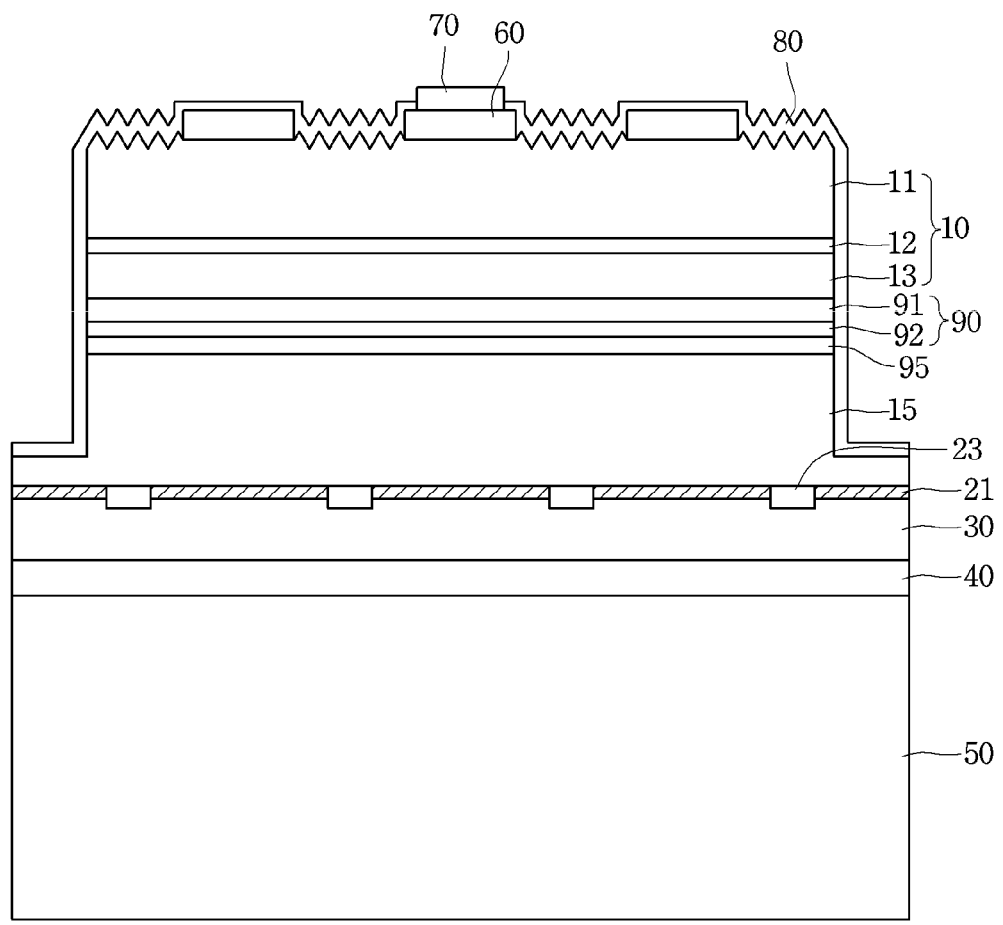

Subsequently, as shown in FIG. 20, a first electrode 60 may be formed on the light emitting structure 10 and isolation etching may be performed to etch the side surface of the light emitting structure 10.

As shown in FIG. 20, a protective layer 80 and an electrode pad 70 may be formed on the light emitting structure 10 and the first electrode 60.

The protective layer 80 may be disposed on the light emitting structure 10. The protective layer 80 may be disposed around the light emitting structure 10. The protective layer 80 may be disposed on the side surface of the light emitting structure 10. The protective layer 80 may be disposed around the window layer 15. Some areas of the protective layer 80 may be disposed on some areas of the window layer 15.

The protective layer 80 may include at least one of oxide or nitride. The protective layer 80 may be formed of at least one selected from a group including $SiO_2$, $Si_xO_y$, $Si_3N_4$, $Si_xN_y$, $SiO_xN_y$, $Al_2O_3$, $TiO_2$, AlN, etc.

The protective layer 80 may be disposed on the first conductive semiconductor layer 11. The protective layer 80 may be disposed on the first electrode 60. The protective layer 80 may include a light extraction structure provided on the upper surface thereof. The light extraction structure may be referred to as an uneven structure. In addition, the light extraction structure may be referred to as roughness. The light extraction structure may be regularly or randomly arranged.

The electrode pad 70 may be electrically connected to the first electrode 60. The electrode pad 70 may be disposed on the first electrode 60. The electrode pad 70 may be disposed to contact the first electrode 60. The electrode pad 70 may be connected to an external power supply to provide a voltage to the light emitting structure 10. The first electrode pad 70 may include at least one selected from among Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc.

The above-described method of manufacturing the light emitting device may be modified as needed or according to manufacturing design.

For example, the light emitting structure may be grown on a GaAs growth substrate and the light emitting structure 10 may be grown to include AlGaInP composition. The window layer 15 may be formed of GaP composition. At this time, if the window layer 15 is formed of GaP composition, the window layer 15 may generate tensile strain force of 20,000 to 30,000 ppm with respect to the GaAs growth substrate due to a difference in lattice constant between two layers, thereby damaging the light emitting structure 10.

The light emitting device according to the embodiment may further include the tensile strain barrier layer 95 in order to prevent the light emitting structure 10 from being damaged. The tensile strain barrier layer 95 may be formed of a material having tensile strain force between the growth substrate and the window layer 15. For example, the tensile strain barrier layer 95 may be provided as a GaInP layer.

Since the tensile strain barrier layer 95 has a low energy band gap, loss may occur in movement of holes to the active layer 12. In consideration of this, the light emitting device according to the embodiment may further include the energy buffer layer 90, the energy band gap of which is changed according to the distance from the light emitting structure 10.

For example, the energy buffer layer 90 may include AlGaINP composition. The energy band gap of the energy buffer layer 90 may be changed according to change in composition ratio of Al. The first area 91 may be provided such that the composition ratio of Al is constant. The energy band gap of the second area 92 may be decreased as the second area 92 becomes far from the first area 91. The composition ratio of Al may be gradually decreased such that the energy band gap of the second area 92 is decreased as the second area 92 becomes far from the first area 91.

For example, the first area 91 may include $(Al_xGa_{(1-x)})_{0.5}In_{0.5}P$ (x=0.85) composition and the second area 92 may include $(Al_xGa_{(1-x)})_{0.5}In_{0.5}P$ ($0.85 \leq x \leq 0.3$) composition. The composition ratio of Al in a portion of the second area 92 adjacent to the first area 91 is 0.85 and is gradually decreased as the second area becomes far from the first area 91, thereby being decreased to up to 0.3.

By sequentially changing the energy band gap of the energy buffer layer 90, it is possible to prevent holes moving from the window layer 15 to the active layer 12 from being lost.

According to the embodiment, an operating voltage can be reduced by improving movement of holes. For example, a light emitting device without the energy buffer layer 90 has an operating voltage of 2.24 V and a light emitting device having the energy buffer layer 90 has an operating voltage of 1.96 V.

For example, the first conductive semiconductor layer 11 may be implemented by $Al_{0.5}In_{0.5}P$ (energy band gap: 2.52 eV), the active layer 12 may be implemented by a well layer of $(Al_{0.1}Ga_{0.9})_{0.5}In_{0.5}P$ (energy band gap: 1.97 eV) and a barrier layer of $(Al_{0.7}Ga_{0.3})_{0.5}In_{0.5}P$ (energy band gap: 2.34 eV), and the second conductive semiconductor layer 13 may be implemented by $Al_{0.5}In_{0.5}P$ (energy band gap: 2.52 eV).

The first area 91 of the energy buffer layer 90 may be implemented by $(Al_{0.85}Ga_{0.15})_{0.5}In_{0.5}P$ (energy band gap: 2.43 eV) and the second area 92 of the energy buffer layer 90 may be implemented such that the composition ratio of Al is gradually decreased from $(Al_{0.85}Ga_{0.15})_{0.5}In_{0.5}P$ (energy band gap: 2.43 eV) to $(Al_{0.3}Ga_{0.7})_{0.5}In_{0.5}P$ (energy band gap: 2.09 eV).

According to the embodiment, the lowest energy band gap of the energy buffer layer 90 may be greater than the energy band gap of the well layer forming the active layer 12 and less than the energy band gap of the window layer 15. In addition, the energy band gap of the tensile strain barrier layer 95 may be greater than that of the well layer forming the active layer 12 and less than that of the window layer 15. If a semiconductor layer having a lower energy band gap than the well layer forming the active layer 12 is present, light absorption occurs therein to prevent light loss.

Figure 21:
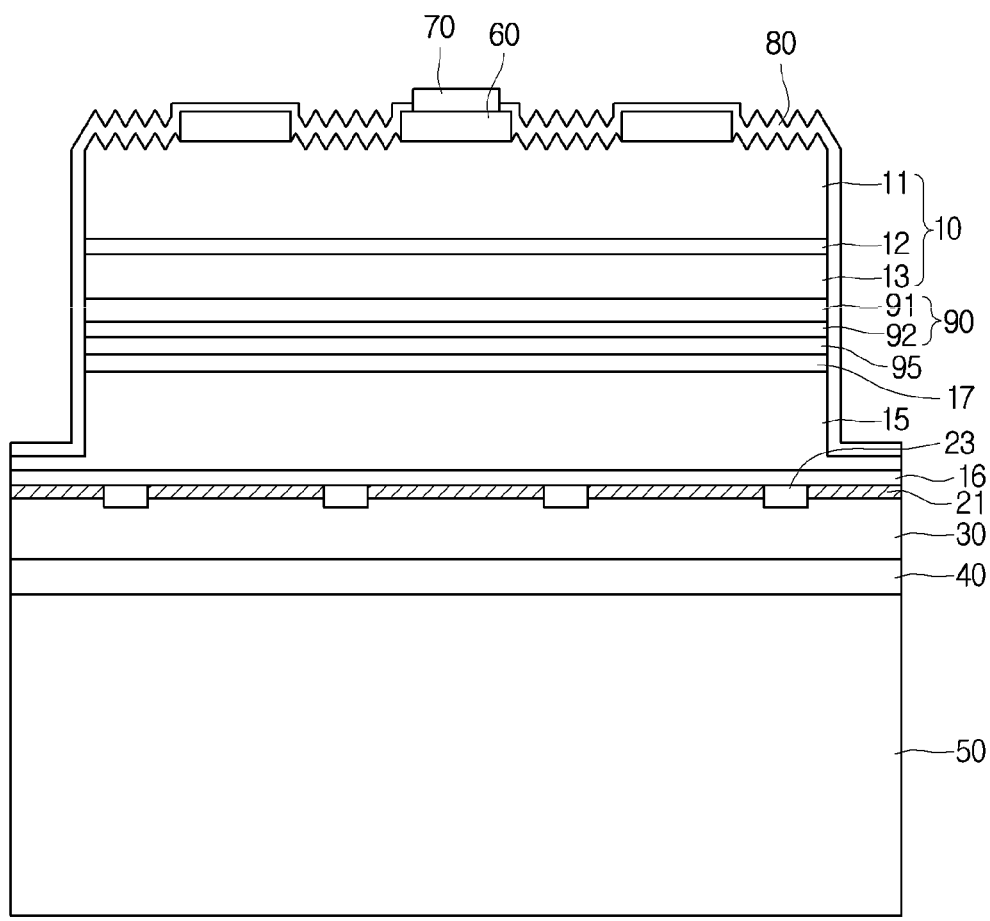
FIG. 21 is a view showing a light emitting device according to an embodiment.

FIG. 21 is a view showing a light emitting device according to an embodiment.

The light emitting device according to the embodiment may include a light emitting structure 10, a first window layer 15 and a second window layer 16, as shown in FIG. 21. The components shown in FIGS. 1 and 15 will be omitted.

The first window layer 15 may be disposed under the light emitting structure 10. The first window layer 15 may include impurities. The first window layer 15 may include impurities having the same polarity as the second conductive semiconductor layer 13. For example, the first window layer 15 may include impurities equal to those included in the second conductive semiconductor layer 13.

The first window layer 15 may be implemented by a semiconductor material having a formula of $(Al_xGa_{1-x})_yIn_{1-y}P (0 \leq x \leq 1, 0 \leq y \leq 1)$. The first window layer 15 may be selected from among AlGaInP, AlInP, GaP, GaInP, etc., for example. The first window layer 15 may provide current spreading effects.

The second window layer 16 may be disposed under the first window layer 15. The second window layer 16 may include impurities different from those included in the first window layer 15. The concentration of the impurities included in the second window layer 16 may be higher than that of the impurities included in the first window layer 15.

The second window layer 16 may be implemented by a semiconductor material having a formula of $(Al_xGa_{1-x})_yIn_{1-y}P (0 \leq x \leq 1, 0 \leq y \leq 1)$. The second window layer 16 may be selected from among AlGaInP, AlInP, GaP, GaInP, etc., for example.

The light emitting device according to the embodiment may include an energy buffer layer 90 disposed between the first window layer 15 and the light emitting structure 10.

Figure 22:
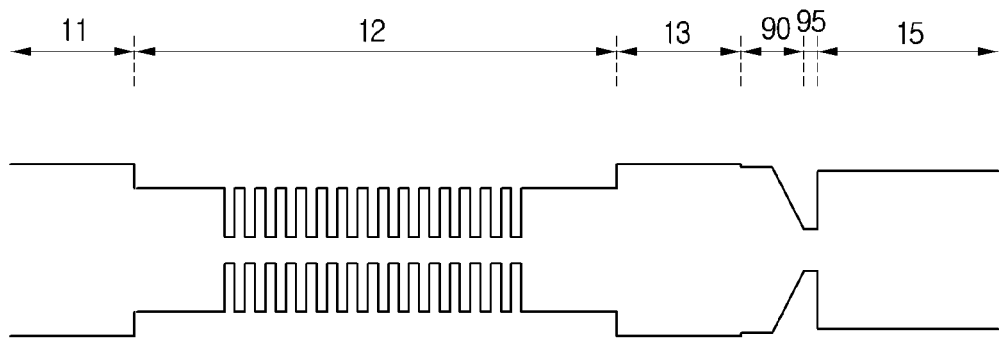
FIG. 22 is a view showing an energy band gap of a semiconductor layer applied to the light emitting device according to the embodiment.

As shown in FIGS. 21 and 22, the energy buffer layer 90 may include a first area 91 and a second area 92. The energy band gap of the first area 91 may be constant regardless of change in distance from the light emitting structure 10. The energy band gap of the second area 92 may be gradually decreased according to the distance from the first area 91.

The light emitting device according to the embodiment may include a tensile strain barrier layer 95 disposed between the energy buffer layer 90 and the first window layer 15.

The tensile strain barrier layer 95 may be disposed under the energy buffer layer 90. The tensile strain barrier layer 95 may be disposed under the second area 92. The tensile strain barrier layer 95 may have an energy band gap less than or equal to that of the energy buffer layer 90. The tensile strain barrier layer 95 may have an energy band gap less than or equal to that of the second area 92. The tensile strain barrier layer 95 may include impurities. For example, the tensile strain barrier layer 95 may include impurities having the same polarity as the second conductive semiconductor layer 13.

The light emitting device according to the embodiment may include an impurity trap layer 17 disposed between the first window layer 15 and the tensile strain barrier layer 95. The impurity trap layer 17 may prevent the impurities included in the first window layer 15 from being diffused into the light emitting structure 10. If the impurities included in the first window layer 15 are diffused into the light emitting structure 10, optical drop may occur and thus light extraction efficiency may deteriorate.

For example, the thickness of the energy buffer layer 90 may be 180 to 250 nanometers. The thickness of the first area 91 may be 170 to 230 nanometers and the thickness of the first area 92 may be 10 to 20 nanometers.

In addition, the thickness of the energy buffer layer 90 may be greater than that of the tensile strain barrier layer 95. For example, the thickness of the tensile strain barrier layer 95 may be 10 to 20 nanometers.

The light emitting device according to the embodiment may include an ODR layer 21, an ohmic contact layer 23 and a reflective layer 30.

The ODR layer 21 may perform a function for reflecting light incident from the upper side thereof upwardly. The ODR layer 21 may have a lower refractive index than the light emitting structure 10. The ODR layer 21 may have a low refractive index which is significantly different from that of the material forming the light emitting structure 10, thereby providing a reflective function. The ODR layer 21 may be disposed to contact the first window layer 15. The ODR layer 21 may have a low refractive index which is significantly different from that of the material forming the first window layer 15, thereby providing a reflective function. The ODR layer 21 may have a low refractive index which is significantly different from that of the material forming the second window layer 16, thereby providing a reflective function.

The ohmic contact layer 23 may be implemented to ohmically contact the second window layer 16. The ohmic contact layer 23 may include an area ohmically contacting the second window layer 16. The ohmic contact layer 23 may be electrically connected to the light emitting structure 10. The ohmic contact layer 23 may be disposed to penetrate through the ODR layer 21. For example, the ohmic contact layer 23 may have an upper surface having a circular or elliptical shape. The ohmic contact layer 23 may include at least one material selected from Au, Au/AuBe/Au, AuZn, ITO, AuBe, GeAu, etc.

The reflective layer 30 may be disposed under the ohmic contact layer 23. The reflective layer 30 may be disposed under the ODR layer 21. The reflective layer 30 may perform a function for reflecting light incident from the upper side thereof upwardly. The reflective layer 30 may include at least one selected from among Ag, Au, Al, etc., for example.

The light emitting device according to the embodiment may include a first electrode 60 and an electrode pad 70 disposed on the light emitting structure 10.

The first electrode 60 may be electrically connected to the first conductive semiconductor layer 11. The first electrode 60 may be disposed to contact the first conductive semiconductor layer 11. The first electrode 60 may be disposed to ohmically contact the first conductive semiconductor layer 11. The first electrode 60 may have an area ohmically contacting the light emitting structure 10. The first electrode 60 may have an area ohmically contacting the first conductive semiconductor layer 11. The first electrode 60 may include at least one selected from among Ge, Zn, Mg, Ca, Au, Ni, AuGe, AuGe/Ni/Au, etc.

A high-concentration impurity semiconductor layer disposed between the first electrode 60 and the first conductive semiconductor layer 11 may be further included. For example, a GaAs layer including high-concentration impurities having a higher impurity concentration than the first conductive semiconductor layer 11 may be further disposed between the first electrode 60 and the first conductive semiconductor layer 11.

The electrode pad 70 may be electrically connected to the first electrode 60. The electrode pad 70 may be disposed on the first electrode 60. The electrode pad 70 may be disposed to contact the first electrode 60. The electrode pad 70 may be connected to an external power supply to provide a voltage to the light emitting structure 10. The first electrode pad 70 may include at least one selected from among Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, etc.

The light emitting device according to the embodiment may include a protective layer 80. The protective layer 80 may be disposed on the light emitting structure 10. The protective layer 80 may be disposed around the light emitting structure 10. The protective layer 80 may be disposed on the side surface of the light emitting structure 10. The protective layer 80 may be disposed around the window layer 15. Some areas of the protective layer 80 may be disposed on some areas of the window layer 15.

The protective layer 80 may be disposed on the first conductive semiconductor layer 11. The protective layer 80 may be disposed on the first electrode 60. The protective layer 80 may include a light extraction structure provided on the upper surface thereof. The light extraction structure may be referred to as an uneven structure. In addition, the light extraction structure may be referred to as roughness. The light extraction structure may be regularly or randomly arranged. The light extraction stricture provided on the upper surface of the protective layer 80 correspond to the light extraction structure provided on the upper surface of the first conductive semiconductor layer 11.

The protective layer 80 may include at least one of oxide or nitride. The protective layer 80 may be formed of at least one selected from a group including $SiO_2$, $Si_xO_y$, $Si_3N_4$, $Si_xN_y$, $SiO_xN_y$, $Al_2O_3$, $TiO_2$, AlN, etc.

According to the embodiment, as shown in FIG. 1, the support substrate 50 may have conductivity and a voltage may be applied to the light emitting structure 10 by an external power supply connected to the support substrate 50. The voltage may be applied to the second conductive semiconductor layer 13 through the support substrate 50.

In addition, according to the embodiment, the second electrode electrically connected to the second conductive semiconductor layer 13 may include at least one of the ohmic contact layer 23, the reflective layer 30, the bonding layer 40 and the support substrate 50.

For example, the light emitting structure 10 may be grown on a GaAs growth substrate and the light emitting structure 10 may be grown to include AlGaInP composition. The window layer 15 may be formed of GaP composition. At this time, if the window layer 15 is formed of GaP composition, the window layer 15 may generate tensile strain force of 20,000 to 30,000 ppm with respect to the GaAs growth substrate due to a difference in lattice constant between two layers, thereby damaging the light emitting structure 10.

The light emitting device according to the embodiment may further include the tensile strain barrier layer 95 in order to prevent the light emitting structure 10 from being damaged. The tensile strain barrier layer 95 may be formed of a material having tensile strain force between the growth substrate and the window layer 15. For example, the tensile strain barrier layer 95 may be provided as a GaInP layer.

Since the tensile strain barrier layer 95 has a low energy band gap, loss may occur in movement of holes to the active layer 12. In consideration of this, the light emitting device according to the embodiment may further include the energy buffer layer 90, the energy band gap of which is changed according to the distance from the light emitting structure 10.

For example, the energy buffer layer 90 may include AlGaInP composition. The energy band gap of the energy buffer layer 90 may be changed according to change in composition ratio of Al. The first area 91 may be provided such that the composition ratio of Al is constant. The energy band gap of the second area 92 may be decreased as the second area 92 becomes far from the first area 91. The composition ratio of Al may be gradually decreased such that the energy band gap of the second area 92 is decreased as the second area 92 becomes far from the first area 91.

For example, the first area 91 may include $(Al_xGa_{(1-x)})_{0.5}In_{0.5}P$ ($0.5 \leq x \leq 0.9$) composition and the second area 92 may include $(Al_xGa_{(1-x)})_{0.5}In_{0.5}P$ ($0.1 \leq x \leq 0.5$) composition. The composition ratio of Al of a portion of the second area 92 adjacent to the first area 91 is equal to that of the first area 91 and is gradually decreased as the second area becomes far from the first area 91.

By sequentially changing the energy band gap of the energy buffer layer 90, it is possible to prevent holes moving from the window layer 15 to the active layer 12 from being lost.

According to the embodiment, an operating voltage can be reduced by improving movement of holes. For example, a light emitting device without the energy buffer layer 90 has an operating voltage of 2.24 V and a light emitting device having the energy buffer layer 90 has an operating voltage of 1.96 V.

For example, the first conductive semiconductor layer 11 may be implemented by $Al_{0.5}In_{0.5}P$ (energy band gap: 2.52 eV), the active layer 12 may be implemented by a well layer of $(Al_{0.1}Ga_{0.9})_{0.5}In_{0.5}P$ (energy band gap: 1.97 eV) and a barrier layer of $(Al_{0.7}Ga_{0.3})_{0.5}In_{0.5}P$ (energy band gap: 2.34 eV), and the second conductive semiconductor layer 13 may be implemented by $Al_{0.5}In_{0.5}P$ (energy band gap: 2.52 eV).

The first area 91 of the energy buffer layer 90 may be implemented by $(Al_{0.85}Ga_{0.15})_{0.5}In_{0.5}P$ (energy band gap: 2.43 eV) and the second area 92 of the energy buffer layer 90 may be implemented such that the composition ratio of Al is gradually decreased from $(Al_{0.85}Ga_{0.15})_{0.5}In_{0.5}P$ (energy band gap: 2.43 eV) to $(Al_{0.3}Ga_{0.7})_{0.5}In_{0.5}P$ (energy band gap: 2.09 eV).

According to the embodiment, the lowest energy band gap of the energy buffer layer 90 may be greater than the energy band gap of the well layer forming the active layer 12 and less than the energy band gap of the window layer 15. In addition, the energy band gap of the tensile strain barrier layer 95 may be greater than that of the well layer forming the active layer 12 and less than that of the window layer 15. If a semiconductor layer having a lower energy band gap than the well layer forming the active layer 12 is present, light absorption occurs therein to prevent light loss.

In the light emitting device according to the embodiment, for example, the first window layer 15 includes Group III or V elements as impurities and the second window layer 16 may include Group IV elements as impurities. The first window layer 15 may include Si or Mg elements as impurities and the second window layer 16 may include C elements as impurities.

For example, the doping concentration of the first window layer 15 is $5 \times 10^{16}/cm^3$ to $1 \times 10^{18}/cm^3$ and the doping concentration of the second window layer 16 may be $5 \times 10^{18}/cm^3$ to $1 \times 10^{20}/cm^3$. In addition, the first window layer 15 may have a thickness of 2,000 nanometers to 5,000 nanometers and the second window layer 16 may have a thickness of 200 nanometers to 500 nanometers.

In the light emitting device according to the embodiment, since the second window layer 16 includes high-concentration impurities, good ohmic contact with the ohmic contact layer 23 may be implemented. Therefore, the light emitting device according to the embodiment can decrease an operating voltage.

In addition, in the conventional light emitting device, in order to add high-concentration impurities, for example, a large amount of Mg elements may be doped as impurities. If a large amount of Mg elements is added as impurities, the Mg elements are diffused into the light emitting structure to generate optical drop.

In contrast, in the light emitting device according to the embodiment, instead of the Mg elements, since the C elements are added as impurities, it is possible to prevent optical drop from being generated due to diffusion of Mg elements.

Then, a method of manufacturing a light emitting device will be described with reference to FIGS. 23 to 26.

Figure 23:
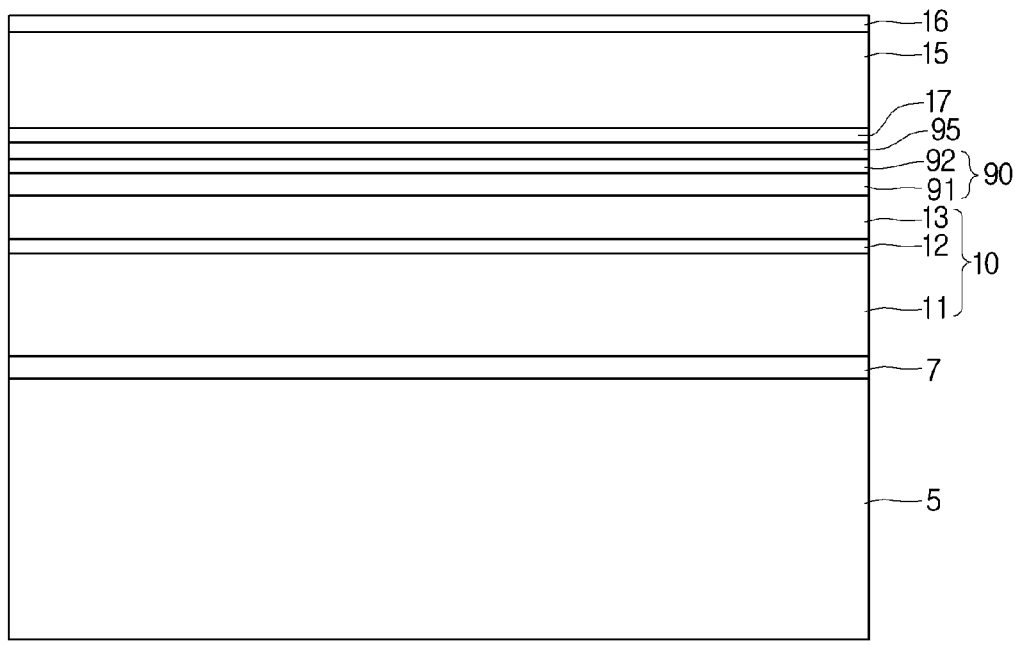
FIGS. 23 to 26 are views showing a method of manufacturing a light emitting device according to an embodiment.

According to the method of manufacturing the light emitting device of the embodiment, as shown in FIG. 23, an etch stop layer 7, a first conductive semiconductor layer 11, an active layer 12, a second conductive semiconductor layer 13, an energy buffer layer 90, a tensile strain barrier layer 95, an impurity trap layer 17, a first window layer 15 and a second window layer 16 may be formed on a substrate 5. The first conductive semiconductor layer 11, the active layer 12 and the second conductive semiconductor layer 13 may be defined as a light emitting structure 10.

The energy buffer layer 90 may be disposed on the light emitting structure 10. The energy buffer layer 90 may include an area, the energy band gap of which is changed according to the distance from the light emitting structure 10. FIG. 22 is a view showing the energy band gap of the semiconductor layer applied to the light emitting device according to the embodiment.

As shown in FIGS. 22 and 23, the energy buffer layer 90 may include a first area 91 and a second area 92. The energy band gap of the first area 91 may be constant regardless of change in distance from the light emitting structure 10. The energy band gap of the second area 92 may be gradually decreased according to the distance from the first area 91.

The impurity trap layer 17 may be implemented by a semiconductor material having a formula of $(Al_xGa_{1-x})_yIn_{1-y}P$ ($0 \leq x \leq 1$, $0 \leq y \leq 1$). The impurity trap layer 17 may be selected from among AlGaInP, AlInP, GaP, GaInP, etc., for example.

The first window layer 15 may be implemented by a semiconductor material having a formula of $(Al_xGa_{1-x})_yIn_{1-y}P$ ($0 \leq x \leq 1$, $0 \leq y \leq 1$). The first window layer 15 may be selected from among AlGaInP, AlInP, GaP, GaInP, etc., for example. The first window layer 15 may provide current spreading effects upon driving the light emitting device.

The second window layer 16 may be implemented by a semiconductor material having a formula of $(Al_xGa_{1-x})_yIn_{1-y}P$ ($0 \leq x \leq 1$, $0 \leq y \leq 1$). The second window layer 15 may be selected from among AlGaInP, AlInP, GaP, GaInP, etc., for example. The second window layer 16 may include impurities of a higher concentration than the first window layer 15.

According to the method of manufacturing the light emitting device of the embodiment, the C elements may be added using an organic material obtained by coupling Ga elements and $CH_3$. For example, an organic material supplied by a conventional Ga source may be used and C elements may be added as high-concentration impurities by decreasing a growth temperature (e.g., 630° C.).

Figure 24:
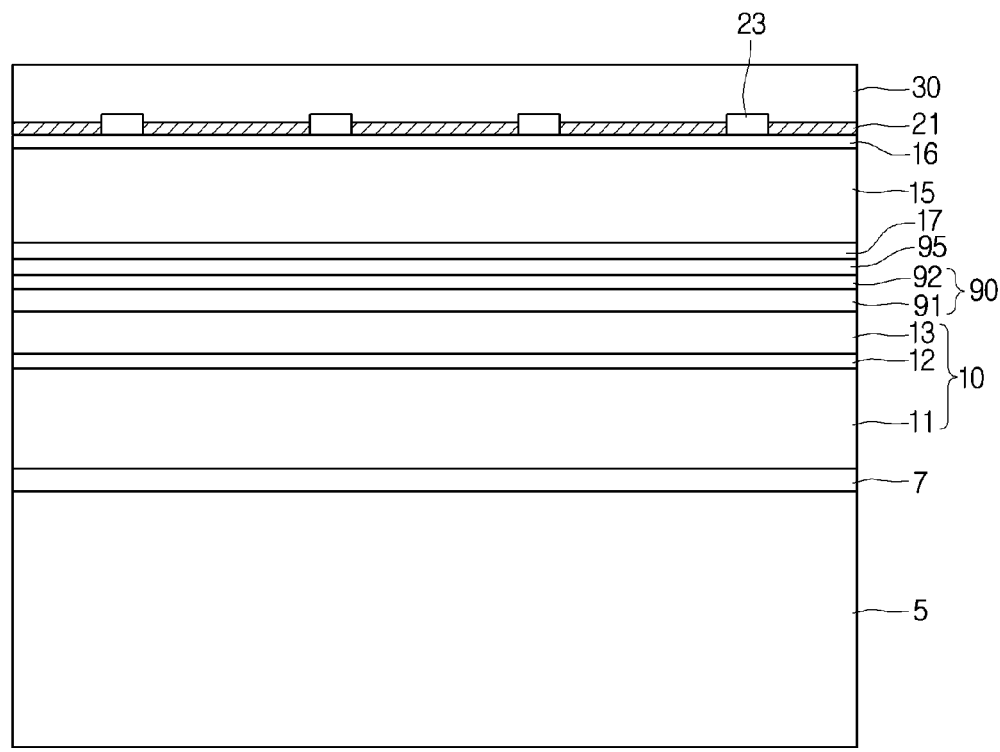

Next, as shown in FIG. 24, an ODR layer 21, an ohmic contact layer 23 and a reflective layer 30 may be formed on the second window layer 16.

The ODR layer may perform a function for reflecting light incident from the upper side thereof upwardly. The ODR layer 21 may have a lower refractive index than the light emitting structure 10. The ODR layer 21 may have a low refractive index which is significantly different from that of the material forming the light emitting structure 10, thereby providing a reflective function. The ODR layer 21 may be disposed to contact the second window layer 16. The ODR layer 21 may have a lower refractive index than the second window layer 16. The ODR layer 21 may have a lower refractive index than the first window layer 11.

The ohmic contact layer 23 may be implemented to ohmically contact the second window layer 16. The ohmic contact layer 23 may include an area ohmically contacting the second window layer 16. The ohmic contact layer 23 may be electrically connected to the light emitting structure 10. The ohmic contact layer 23 may be disposed to penetrate through the ODR layer 21. For example, the ohmic contact layer 23 may have an upper surface having a circular or elliptical shape. The ohmic contact layer 23 may include at least one selected from Au, Au/AuBe/Au, AuZn, ITO, AuBe, GeAu, etc.

The reflective layer 30 may be disposed on the ohmic contact layer 23. The reflective layer 30 may be disposed on the ODR layer 21. The reflective layer 30 may perform a function for reflecting incident light again. The reflective layer 30 may include at least one selected from among Ag, Au, Al, etc., for example.

Figure 25:
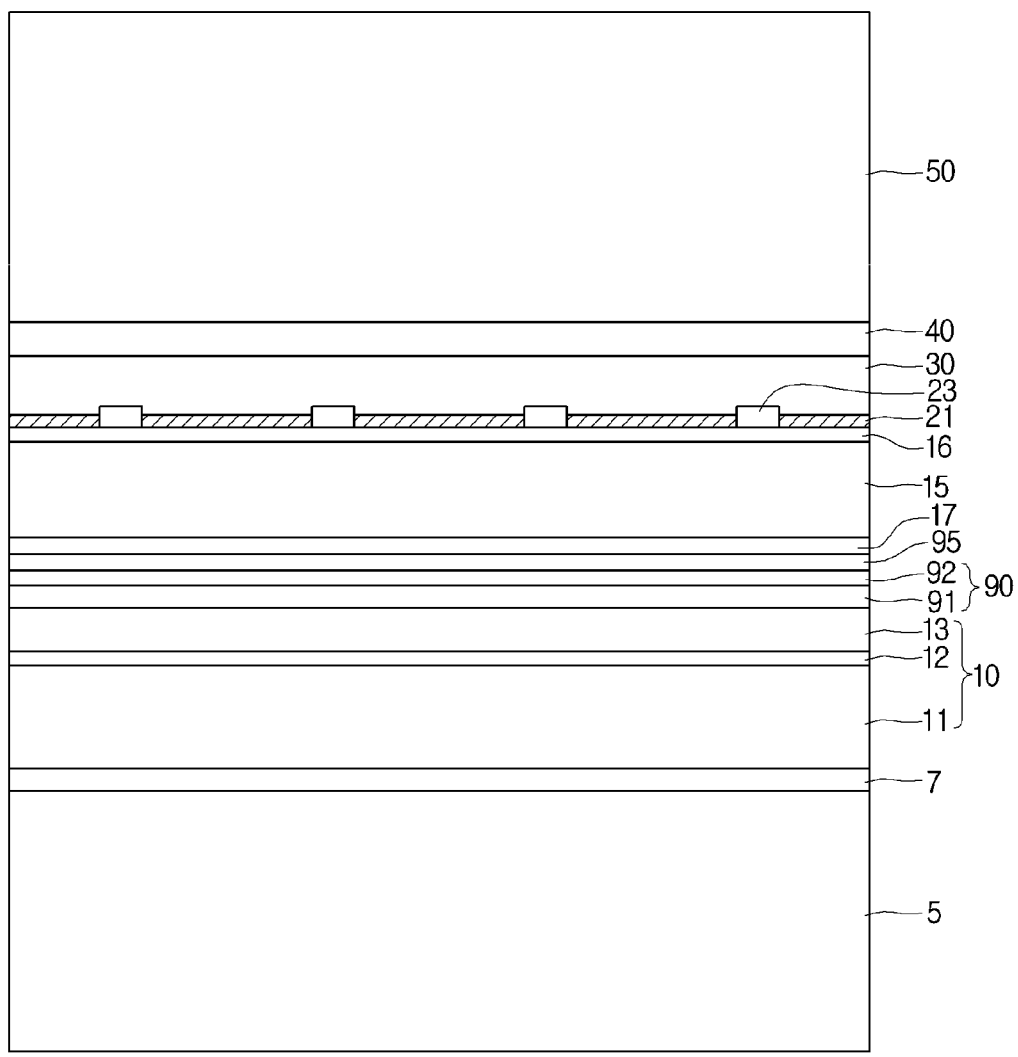

Subsequently, as shown in FIG. 25, the boding layer 40 and the support substrate 50 may be provided on the reflective layer 30.

Figure 26:
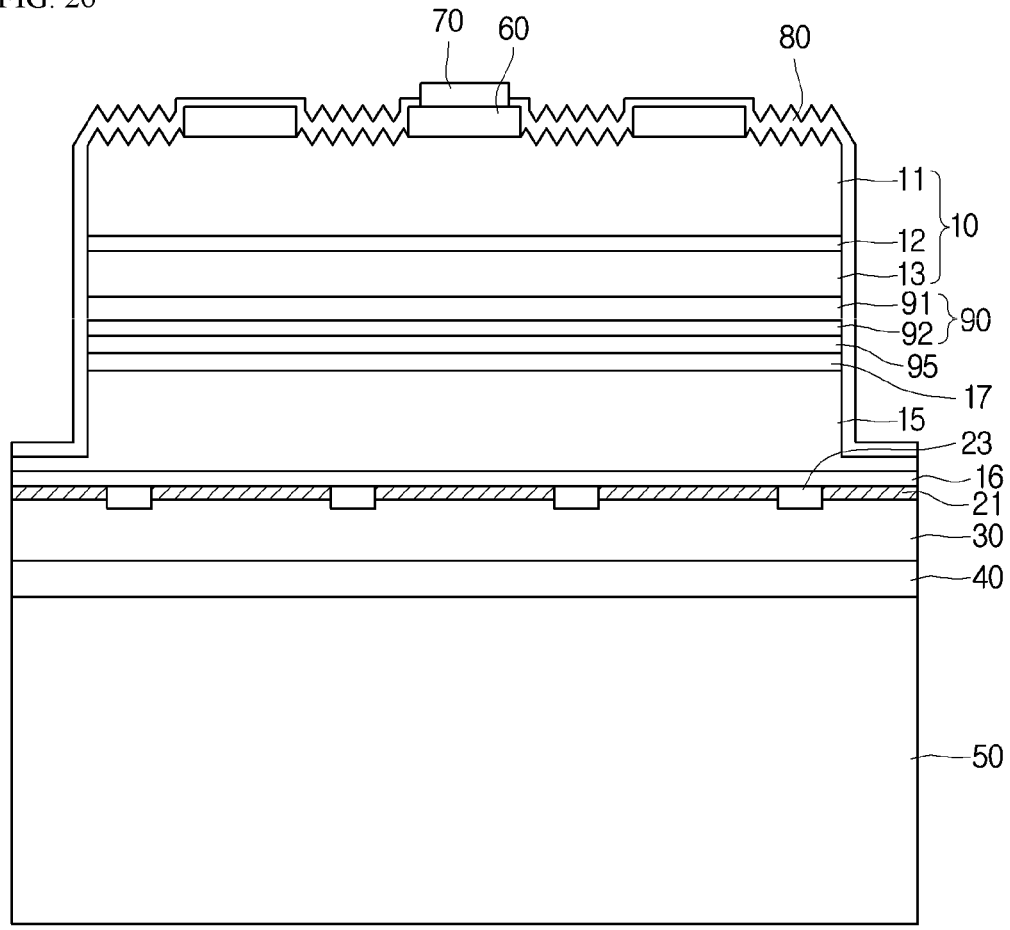

Subsequently, as shown in FIG. 26, a first electrode 60 may be formed on the light emitting structure 10 and isolation etching may be performed such that the side surface of the light emitting structure 10 may be etched.

In addition, as shown in FIG. 26, a protective layer 80 and an electrode pad 70 may be formed on the light emitting structure 10 and the first electrode 60.

The above-described method of manufacturing the light emitting device may be modified as needed or according to manufacturing design.

For example, the light emitting structure 10 may be grown on a GaAs growth substrate and the light emitting structure 10 may be grown to include AlGaInP composition. The window layer 15 may be formed of GaP composition. At this time, if the window layer 15 is formed of GaP composition, the window layer 15 may generate tensile strain force of 20,000 to 30,000 ppm with respect to the GaAs growth substrate due to a difference in lattice constant between two layers, thereby damaging the light emitting structure 10.

The light emitting device according to the embodiment may further include the tensile strain barrier layer 95 in order to prevent the light emitting structure 10 from being damaged. The tensile strain barrier layer 95 may be formed of a material having tensile strain force between the growth substrate and the window layer 15. For example, the tensile strain barrier layer 95 may be provided as a GaInP layer.

Since the tensile strain barrier layer 95 has a low energy band gap, loss may occur in movement of holes to the active layer 12. In consideration of this, the light emitting device according to the embodiment may further include the energy buffer layer 90, the energy band gap of which is changed according to the distance from the light emitting structure 10.

For example, the energy buffer layer 90 may include AlGaInP composition. The energy band gap of the energy buffer layer 90 may be changed according to change in composition ratio of Al. The first area 91 may be provided such that the composition ratio of Al is constant. The energy band gap of the second area 92 may be decreased as the second area 92 becomes far from the first area 91. The composition ratio of Al may be gradually decreased such that the energy band gap of the second area 92 is decreased as the second area 92 becomes far from the first area 91.

For example, the first area 91 may include $(Al_xGa_{(1-x)})_{0.5}In_{0.5}P$ (x=0.85) composition and the second area 92 may include $(Al_xGa_{(1-x)})_{0.5}In_{0.5}P$ (0.85≤x≤0.3) composition. The composition ratio of Al in a portion of the second area 92 adjacent to the first area 91 is 0.85 and is gradually decreased as the second area becomes far from the first area 91, thereby being decreased to up to 0.3.

By sequentially changing the energy band gap of the energy buffer layer 90, it is possible to prevent holes moving from the window layer 15 to the active layer 12 from being lost.

According to the embodiment, an operating voltage can be reduced by improving movement of holes. For example, a light emitting device without the energy buffer layer 90 has an operating voltage of 2.24 V and a light emitting device having the energy buffer layer 90 has an operating voltage of 1.96 V.

For example, the first conductive semiconductor layer 11 may be implemented by $Al_{0.5}In_{0.5}P$ (energy band gap: 2.52 eV), the active layer 12 may be implemented by a well layer of $(Al_{0.1}Ga_{0.9})_{0.5}In_{0.5}P$ (energy band gap: 1.97 eV) and a barrier layer of $(Al_{0.7}Ga_{0.3})_{0.5}In_{0.5}P$ (energy band gap: 2.34 eV), and the second conductive semiconductor layer 13 may be implemented by $Al_{0.5}In_{0.5}P$ (energy band gap: 2.52 eV).

The first area 91 of the energy buffer layer 90 may be implemented by $(Al_{0.85}Ga_{0.15})_{0.5}In_{0.5}P$ (energy band gap: 2.43 eV) and the second area 92 of the energy buffer layer 90 may be implemented such that the composition ratio of Al is gradually decreased from $(Al_{0.85}Ga_{0.15})_{0.5}In_{0.5}P$ (energy band gap: 2.43 eV) to $(Al_{0.3}Ga_{0.7})_{0.5}In_{0.5}P$ (energy band gap: 2.09 eV).

According to the embodiment, the lowest energy band gap of the energy buffer layer 90 may be greater than the energy band gap of the well layer forming the active layer 12 and less than the energy band gap of the window layer 15. In addition, the energy band gap of the tensile strain barrier layer 95 may be greater than that of the well layer forming the active layer 12 and less than that of the window layer 15. If a semiconductor layer having a lower energy band gap than the well layer forming the active layer 12 is present, light absorption occurs therein to prevent light loss.

In the light emitting device according to the embodiment, for example, the first window layer 15 includes Group III or V elements as impurities and the second window layer 16 may include Group IV elements as impurities. The first window layer 15 may include Si or Mg elements as impurities and the second window layer 16 may include C elements as impurities.

For example, the doping concentration of the first window layer 15 is $5 \times 10^{16}/cm^3$ to $1 \times 10^{18}/cm^3$ and the doping concentration of the second window layer 16 may be $5 \times 10^{18}/cm^3$ to $1 \times 10^{20}/cm^3$. In addition, the first window layer 15 may have a thickness of 2,000 nanometers to 5,000 nanometers and the second window layer 16 may have a thickness of 200 nanometers to 500 nanometers.

In the light emitting device according to the embodiment, since the second window layer 16 includes high-concentration impurities, good ohmic contact with the ohmic contact layer 23 may be implemented. Therefore, the light emitting device according to the embodiment can decrease an operating voltage.

In addition, in the conventional light emitting device, in order to add high-concentration impurities, for example, a large amount of Mg elements may be doped as impurities. If a large amount of Mg elements is added as impurities, the Mg elements are diffused into the light emitting structure to generate optical drop.

In contrast, in the light emitting device according to the embodiment, instead of the Mg elements, since the C elements are added as impurities, it is possible to prevent optical drop from being generated due to diffusion of Mg elements.

Figure 27:
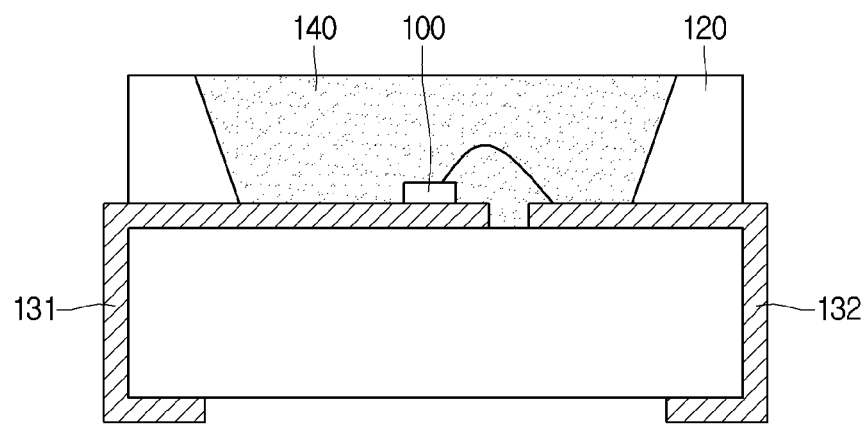
FIG. 27 is a view showing a light emitting device package according to an embodiment.

FIG. 27 is a view showing a light emitting device package including a light emitting device according to an embodiment.

Referring to FIG. 27, the light emitting device package according to the embodiment may include a body 120, a first lead electrode 131 and a second lead electrode 132 disposed on the body 120, the light emitting device 100 according to the embodiment, which is provided on the body 120 to be electrically connected to the first lead electrode 131 and the second lead electrode 132, and a molding member 140 surrounding the light emitting device 100.

The body 120 may be formed of a silicon material, a synthetic resin material or a metal material and may include an inclined surface formed around the light emitting device 100.

The first lead electrode 131 and the second lead electrode 132 are electrically disconnected from each other to supply a voltage to the light emitting device 100. In addition, the first lead electrode 131 and the second lead electrode 132 may reflect light generated in the light emitting device 100 to increase light efficiency and discharge heat generated in the light emitting device 100.

The light emitting device 100 may be disposed on the body 120, the first lead electrode 131 or the second lead electrode 132.

The light emitting device 100 may be electrically connected to the first lead electrode 131 and the second lead electrode 132 using any one of a wiring method, a flip chip method or a die bonding method.

The molding member 140 may surround the light emitting device 100 to protect the light emitting device 100. In addition, phosphors may be included in the molding member 140 to change the wavelength of light emitted from the light emitting device 100.

A plurality of light emitting devices or light emitting device packages according to the embodiment may be arranged on a substrate, and a lens, a light guide plate, a prism sheet, a diffusion sheet, etc. which are optical members, may be provided on an optical path of the light emitting device packages. Such light emitting device package, substrate and optical member may function as a light unit. The light unit is implemented in a top view or a side view type and is provided in a display apparatus of a portable terminal and a laptop or is variously applicable to a lighting apparatus and an indicator apparatus. Another embodiment may be implemented by a lighting apparatus including the light emitting device or the light emitting device package described in the above-described embodiments. For example, the lighting apparatus may include a lamp, a streetlamp, an electronic display board, a headlight, etc.

The light emitting device according to the embodiment is applicable to a light unit. The light unit has a structure in which a plurality of light emitting devices is arranged and may include display apparatuses shown in FIGS. 28 and 29 and a lighting apparatus shown in FIG. 30.

Figure 28:
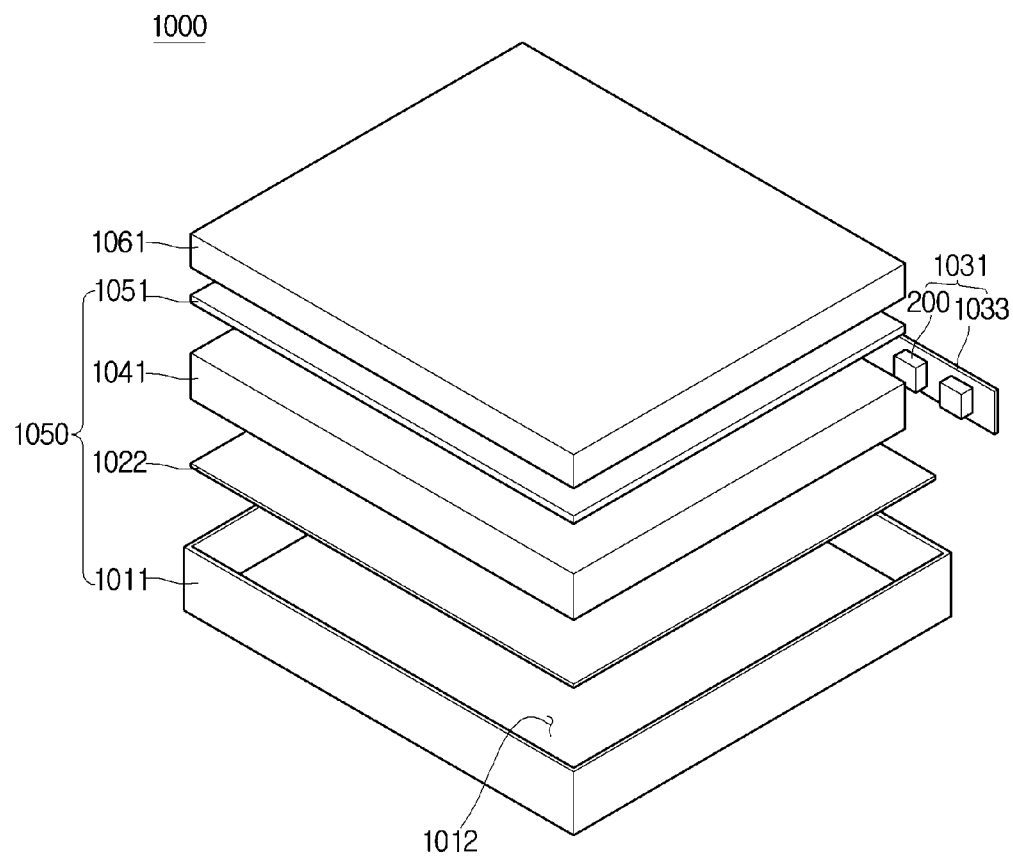
FIG. 28 is a view showing a display apparatus according to an embodiment.

Referring to FIG. 28, the display apparatus 1000 according to the embodiment may include a light guide plate 1041, a light emitting module 1031 for providing light to the light guide plate 1041, a reflective member 1022 disposed under the light guide plate 1041, an optical sheet 1051 disposed on the light guide plate 1041, a display panel 1061 disposed on the optical sheet 1051, and a bottom cover 1011 for accommodating the display panel 1061, the light guide plate 1041, the light emitting module 1031 and the reflective member 1022, without being limited thereto.

The bottom cover 1011, the reflective member 1022, the light guide plate 1041 and the optical sheet 1051 may be defined as a light unit 1050.

The light guide plate 1041 serves to diffuse light to convert light into surface light. The light guide plate 1041 may be formed of a transparent material and may include one of acrylic resin of polymethyl methacrylate (PMMA), polyethylene terephthalate (PET), polycarbonate (PC), cycloolefin copolymer (COC) and polyethylene naphthalate (PEN) resin.

The light emitting module 1031 provides light to at least one side surface of the light guide plate 1041 and functions as a light source of a display apparatus.

At least one light emitting module 1031 may be provided to directly or indirectly provide light at one side of the light guide plate 1041. The light emitting module 1031 may include a substrate 1033 and the light emitting devices or light emitting device packages 200 according to the above-described embodiment. The light emitting device packages 200 may be arranged on the substrate 1033 at a predetermined interval.

The substrate 1033 may be a printed circuit board (PCB) including a circuit pattern. The substrate 1033 may include a normal PCB, a metal core PCB (MCPCB), a flexible PCB (FPCB), etc., without being limited thereto. If the light emitting device package 200 is provided on the side surface of the bottom cover 1011 or on a heat dissipation plate, the substrate 1033 may be removed. Here, a portion of the heat dissipating plate may contact an upper surface of the bottom cover 1011.

The plurality of light emitting device packages 200 may be mounted such that an exit surface for emitting light is spaced apart from the light guide plate 1041 by a predetermined distance, without being limited thereto. The light emitting device package 200 may directly or indirectly provide light to an incident surface which is one surface of the light guide plate 1041, without being limited thereto.

The reflective member 1022 may be disposed under the light guide plate 1041. The reflective member 1022 may reflect light incident on the lower surface of the light guide plate 1041 to direct light upward, thereby improving brightness of the light unit 1050. Although the reflective member 1022 may be formed of, for example, PET, PC, PVC resin, etc., the present invention is not limited thereto. Although the reflective member 1022 may be the upper surface of the bottom cover 1011, the present invention is not limited thereto.

The bottom cover 1011 may accommodate the light guide plate 1041, the light emitting module 1031 and the reflective member 1022. To this end, the bottom cover 1011 may include an accommodation part 1012 having a box shape having an opened upper surface thereof, without being limited thereto. The bottom cover 1011 may be coupled to a top cover, without being limited thereto.

The bottom cover 1011 may be formed of a metal material or a resin material and may be manufactured using a press molding process or an extrusion molding process. The bottom cover 1011 may include a metal or non-metal material having good heat conductivity, without being limited thereto.

The display panel 1061 is, for example, an LCD panel and includes first and second substrates facing each other and made of a transparent material, and a liquid crystal layer interposed between the first and second substrates. A polarization plate may be attached to at least one surface of the display panel 1061 and the attachment structure of the polarization plate is not limited thereto. The display panel 1061 displays information by light passing through the optical sheet 1051. The display apparatus 1000 is applicable to various types of mobile terminals, a monitor of a laptop, a television, etc.

The optical sheet 1051 is disposed between the display panel 1061 and the light guide plate 1041 and includes at least one transparent sheet. The optical sheet 1051 may include at least one of a diffusion sheet, a horizontal prism sheet, a vertical prism sheet, and a brightness enhancement sheet. The diffusion sheet diffuses incident light, and the horizontal and/or vertical prism sheets focus incident light onto a display area and the brightness enhancement sheet reuses lost light to enhance brightness. A protective sheet may be provided on the display panel 1061, without being limited thereto.

Here, the light guide plate 1041 and the optical sheet 1051 may be included on the optical path of the light emitting module 1031 as optical members, without being limited thereto.

Figure 29:
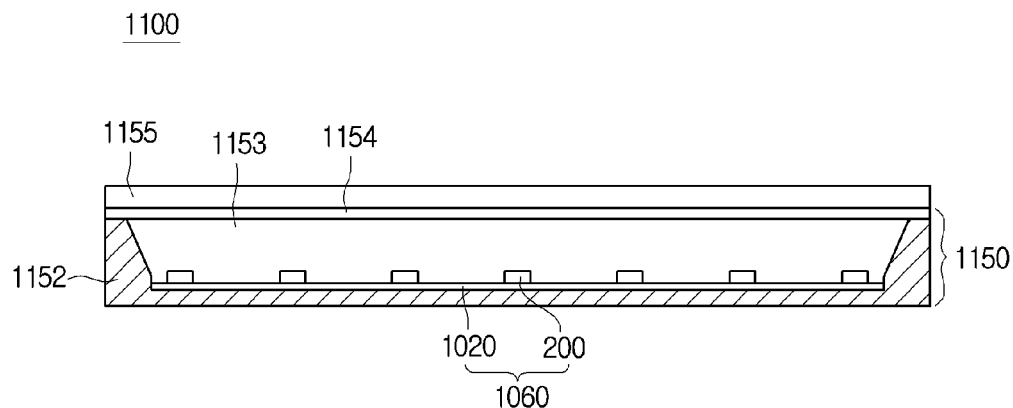
FIG. 29 is a view showing another example of the display apparatus according to the embodiment.

FIG. 29 is a diagram showing another example of the display apparatus according to the embodiment.

Referring to FIG. 29, the display apparatus 1100 may include a bottom cover 1152, a substrate 1020, on which the light emitting devices 100 are arranged, an optical member 1154, and a display panel 1155. The substrate 1020 and the light emitting device package 200 may be defined as a light emitting module 1060. The bottom cover 1152 may include an accommodation part 1153, without being limited thereto.

Here, the optical member 1154 may include at least one of a lens, a light guide plate, a diffusion sheet, horizontal and vertical prism sheets and a brightness enhancement sheet. The light guide plate may be formed of a PC material or a PMMA material and may be removed. The diffusion sheet diffuses incident light, and the horizontal and/or vertical prism sheets focus incident light onto a display area and the brightness enhancement sheet reuses lost light to enhance brightness.

The optical member 1154 is disposed on the light emitting module 1060 and converts light emitted from the light emitting module 1060 into surface light or diffuses or focuses light.

Figure 30:
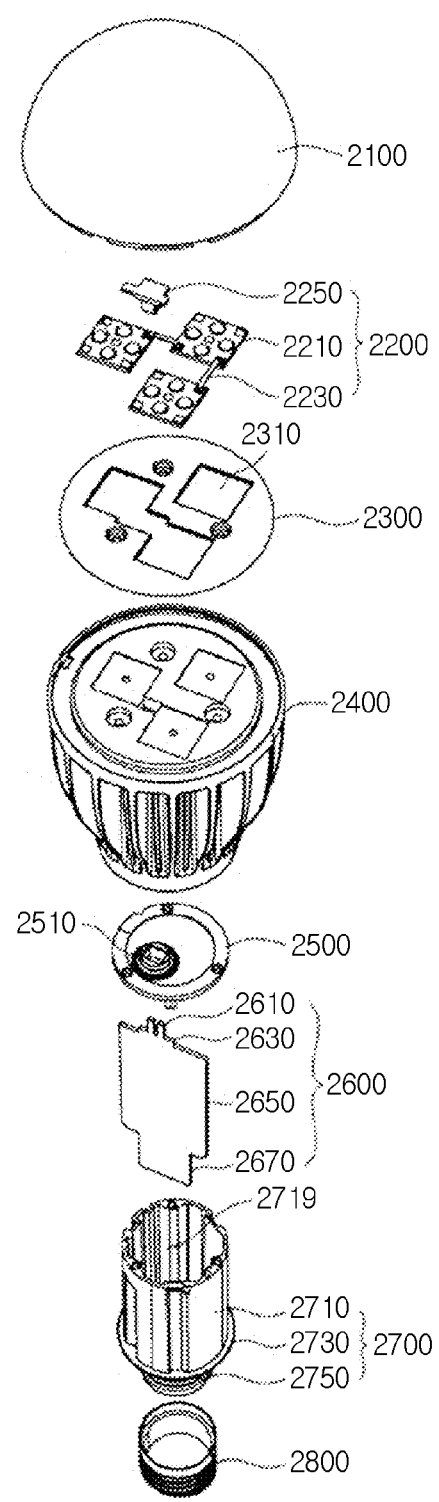
FIG. 30 is a view showing a lighting apparatus according to an embodiment.

FIG. 30 is a diagram showing a lighting apparatus according to an embodiment.

Referring to FIG. 30, the lighting apparatus according to the embodiment may include a cover 2100, a light source module 2200, a heat dissipating body 2400, a power supply 2600, an inner case 2700, and a socket 2800. In addition, the lighting apparatus according to the embodiment may further include one or more of a member 2300 and a holder 2500. The light source module 220 may include the light emitting device package according to the embodiment.

For example, the cover 2100 has a bulb or semispherical shape, the inside thereof is hollow and a portion thereof is opened. The cover 2100 may be optically coupled to the light source module 2200. For example, the cover 2100 may diffuse, scatter or excite light received from the light source module 2200. The cover 2100 may be an optical member. The cover 2100 may be coupled with the heat dissipating body 2400. The cover 2100 may have a coupling part for coupling with the heat dissipating body 2400.

The inner surface of the cover 2100 may be coated with a milky coating material. The milky coating material may include a diffusion material. The surface roughness of the inner surface of the cover 2100 may be greater than that of the outer surface of the cover 2100, in order to sufficiently diffuse and scatter light from the light source module 220 to emit light.

The material of the cover 2100 may be glass, plastic, polypropylene (PP), polyethylene (PE), polycarbonate (PC), etc. Here, polycarbonate is excellent in terms of light resistance, thermal resistance and strength. The cover 2100 may be transparent such that the light source module 220 is visible from outside or may not be transparent. The cover 2100 may be formed through blow molding.

The light source module 2200 may be disposed on one surface of the heat dissipating body 2400. Accordingly, heat from the light source module 2200 is transferred to the heat dissipating body 2400. The light source module 2200 may include light sources 2210, a connection plate 2230 and a connector 2250.

The member 2300 is disposed on the upper surface of the heat dissipating body 2400 and has guide grooves 2310, into which the plurality of light sources 2210 and the connector 2250 are inserted. The guide grooves 2310 correspond to the substrates of the light sources 2210 and the connector 2250.

The surface of the member 2300 may be applied or coated with a reflective material. For example, the surface of the member 2300 may be applied or coated with a white coating material. The member 2300 reflects light, which reflects from the inner surface of the cover 2100 and returns to the light source module 2200, toward the cover 2100 again. Accordingly, light efficiency of the lighting apparatus according to the embodiment can be improved.

The member 2300 may be formed of an insulation material. The connection plate 2230 of the light source module 2200 may include an electrical conduction material. Accordingly, the heat dissipating body 2400 and the connection plate 2230 may be electrically connected to each other. The member 2300 is formed of an insulation material to disconnect the connection plate 2230 and the heat dissipating body 2400. The heat dissipating body 2400 dissipates heat from the light source module 2200 and heat from the power supply 2600.

The holder 2500 blocks the accommodation groove 2719 of the insulation part 2710 of the inner case 2700. Accordingly, the power supply 2600 accommodated in the insulation part 2710 of the inner case 2700 is enclosed. The holder 2500 has a guide protrusion 2610. The guide protrusion 2510 has a hole, through the protrusion 2610 of the power supply 2600 penetrates.

The power supply 2600 processes or converts an external electrical signal and supplies the converted or processed signal to the light source module 2200. The power supply 2600 is accommodated in the accommodation groove 2719 of the inner case 2700 and is enclosed in the inner case 2700 by the holder 2500.

The power supply 2600 may include a protrusion 2610, a guide 2630, a base 2650 and an extension 2670.

The guide 2630 protrudes from one side of the base 2650 outwardly. The guide 2630 may be inserted into the holder 2500. A plurality of parts may be disposed on one surface of the base 2650. The plurality of parts may include, for example, an AC-DC converter for converting an AC voltage received from an external power supply into a DC voltage, a driving chip for controlling driving of the light source module 2200, and an electrostatic discharge (ESD) protection device for protecting the light source module 220, without being limited thereto.

The extension 2670 protrudes from another side of the base 2650 outwardly. The extension 2670 is inserted into the connector 2750 of the inner case 2700 to receive an external electrical signal.

For example, the width of the extension 2670 may be equal to or less than that of the connector 2750 of the inner case 2700. One end of each of a "+ wire" and a "− wire" is electrically connected to the extension 2670 and the other end of each of the "+ wire" and the "− wire" is electrically connected to the socket 2800.

The inner case 2700 may include a molding part provided therein in addition to the power supply 2600. The molding part is obtained by hardening molding liquid and fixes the power supply 2600 in the inner case 2700.

The features, structures and effects of the embodiments are included in at least one embodiment of the present invention and are not limited to one embodiment. Further, the features, structures and effects of each embodiment may be combined or modified by those skilled in the art in other embodiments. Accordingly, the description related to such combinations and modifications should be interpreted as being within the scope of the present invention.

Although the preferred embodiments have been disclosed, the embodiments are purely exemplary and do not limit the present disclosure. Those skilled in the art will appreciate that various modifications and applications are possible, without departing from the embodiments. For example, the components described in the embodiments may be modified and embodied. Further, differences related to such modifications and applications should be interpreted as being within the scope of the present disclosure defined by the accompanying claims.

The invention claimed is:

1. A light emitting device comprising:
a light emitting structure including a first conductive semiconductor layer, an active layer disposed under the first conductive semiconductor layer, and a second conductive semiconductor layer disposed under the active layer;
a protective layer disposed on the light emitting structure and including a plurality of through-holes;
a first electrode provided in the plurality of through-holes and including a plurality of metal dots electrically connected to the first conductive semiconductor layer;
an electrode pad electrically connecting the plurality of metal dots configuring the first electrode and having a first area disposed on the first electrode and a second area disposed on the protective layer; and
a second electrode electrically connected to the second conductive semiconductor layer,
wherein a refractive index of the protective layer disposed under the second area of the electrode pad is less than that of a second protective layer provided in an area in which the electrode pad is not disposed, the protective layer includes oxide and the second protective layer includes nitride.

2. The light emitting device according to claim 1, wherein the first electrode includes a first area and a second area spaced apart from each other and the electrode pad is electrically connected to the first area and the second area.

3. The light emitting device according to claim 1, wherein the first conductive semiconductor layer includes a light extraction structure provided on an upper surface thereof.

4. The light emitting device according to claim 1, wherein a width of the metal dots of the first electrode is 4 to 5 micrometers, and a refractive index of the protective layer is less than that of the first conductive semiconductor layer.

5. The light emitting device according to claim 1, wherein the first electrode includes a main electrode and a peripheral electrode extending from the main electrode, and the main electrode and the peripheral electrode are disposed in a penetration area of the protective layer.

6. A light emitting device comprising:
a light emitting structure including a first conductive semiconductor layer, an active layer disposed under the first conductive semiconductor layer, and a second conductive semiconductor layer disposed under the active layer;
a protective layer disposed on the light emitting structure and including a plurality of through-holes;
a first electrode provided in the plurality of through-holes and including a plurality of metal dots electrically connected to the first conductive semiconductor layer;
an electrode pad electrically connecting the plurality of metal dots configuring the first electrode and having a first area disposed on the first electrode and a second area disposed on the protective layer; and
a second electrode electrically connected to the second conductive semiconductor layer,
wherein the first electrode includes a main electrode and a peripheral electrode extending from the main electrode, and the main electrode and the peripheral electrode are disposed in a penetration area of the protective layer,
wherein the peripheral electrode is provided in plurality, and
wherein a size of one of the peripheral electrodes that is located far from the main electrode has a smaller size than other ones of the peripheral electrodes.

7. The light emitting device according to claim 6, wherein the electrode pad includes a main pad and a finger pad.

8. The light emitting device according to claim 7, wherein the finger pad is in contact with the peripheral electrodes, and
wherein the finger pad is in contact with the protective layer between the peripheral electrodes.

9. The light emitting device according to claim 6, wherein an area of the main pad is greater than that of the main electrode, and
wherein the protective layer is disposed under the main pad.

10. The light emitting device according to claim 1, further comprising:
a window layer under the second conductive semiconductor layer; and
an omni directional reflector (ODR) layer, an ohmic contact layer and a reflective layer under the window layer.

11. The light emitting device according to claim 10, wherein the ODR layer has a lower refractive index than the light emitting structure.

12. The light emitting device according to claim 10, wherein the ODR layer includes oxide or nitride.

13. The light emitting device according to claim 10, wherein the ohmic contact layer penetrates through the ODR layer.

14. The light emitting device according to claim 10, wherein the ohmic contact layer is implemented to ohmically contact the window layer.

15. The light emitting device according to claim 10, wherein the reflective layer is under the ohmic contact layer.

16. The light emitting device according to claim 10, further comprising:
   a bonding layer under the reflective layer; and
   a support substrate under the bonding layer.

17. The light emitting device according to claim 10, wherein the protective layer is disposed around the window layer.

18. The light emitting device according to claim 10, wherein some areas of the protective layer are disposed on some areas of the window layer.

19. The light emitting device according to claim 10, wherein the protective layer is not in contact with some areas of the window layer.

20. The light emitting device according to claim 8, wherein the finger pad is electrically connected to the main electrode and at least one peripheral electrode.

* * * * *